(12) United States Patent
Yasuoka

(10) Patent No.: US 11,616,156 B2
(45) Date of Patent: Mar. 28, 2023

(54) SEMICONDUCTOR DEVICE COMPRISING A MONITOR INCLUDING A SECOND SEMICONDUCTOR LAYER IN WHICH DARK CURRENT IS CHANGED BY A HEATER

(71) Applicant: FUJITSU OPTICAL COMPONENTS LIMITED, Kawasaki (JP)

(72) Inventor: Nami Yasuoka, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 546 days.

(21) Appl. No.: 16/854,489

(22) Filed: Apr. 21, 2020

(65) Prior Publication Data
US 2020/0343398 A1    Oct. 29, 2020

(30) Foreign Application Priority Data

Apr. 23, 2019 (JP) .............................. JP2019-082207

(51) Int. Cl.
| | | |
|---|---|---|
| H01L 31/052 | (2014.01) | |
| H01L 31/0525 | (2014.01) | |
| H01L 31/0745 | (2012.01) | |
| H01L 31/054 | (2014.01) | |
| H01L 23/34 | (2006.01) | |

(52) U.S. Cl.
CPC ........ *H01L 31/0525* (2013.01); *H01L 23/345* (2013.01); *H01L 31/054* (2014.12); *H01L 31/0745* (2013.01)

(58) Field of Classification Search
CPC ..... H01L 31/00; H01L 31/024; H01L 31/052; H01L 23/34; H01L 31/0745

USPC ............................................ 250/238, 214 R
See application file for complete search history.

(56) References Cited

U.S. PATENT DOCUMENTS

| | | |
|---|---|---|
| 6,192,170 B1 | 2/2001 | Komatsu |
| 8,760,544 B2 * | 6/2014 | Tanabe ...................... G01T 1/17 |
| | | 250/370.15 |
| 2018/0266881 A1 | 9/2018 | Fujiwara et al. |
| 2019/0035948 A1 | 1/2019 | Bayn et al. |

FOREIGN PATENT DOCUMENTS

| | | |
|---|---|---|
| JP | 2000-174397 A | 6/2000 |
| JP | 2001-289711 | 10/2001 |
| JP | 2017-152434 A | 8/2017 |
| JP | 2018-074104 A | 5/2018 |
| JP | 2018-157032 | 10/2018 |

OTHER PUBLICATIONS

Office Action dated Dec. 6, 2022, issued in Japan Patent Application No. 2019-082207.

* cited by examiner

*Primary Examiner* — Que Tan Le
(74) *Attorney, Agent, or Firm* — Staas & Halsey LLP

(57) ABSTRACT

An optical semiconductor element includes an optical receiver including a first semiconductor layer, a heater for heating the first semiconductor layer; and a monitor. A first semiconductor layer that absorbs light and generates electric carriers; a heater for heating the first semiconductor layer; and a monitor including a second semiconductor layer in which dark current is changed by heat generated by the heater.

20 Claims, 32 Drawing Sheets

US 11,616,156 B2

SEMICONDUCTOR DEVICE COMPRISING A MONITOR INCLUDING A SECOND SEMICONDUCTOR LAYER IN WHICH DARK CURRENT IS CHANGED BY A HEATER

CROSS-REFERENCE TO RELATED APPLICATION

This application is based upon and claims the benefit of priority of the prior Japanese Patent Application No. 2019-82207, filed on Apr. 23, 2019, the entire contents of which are incorporated herein by reference.

FIELD

The embodiments discussed herein are related to an optical semiconductor element and an optical semiconductor device.

BACKGROUND

An optical semiconductor element having a Ge layer as a light absorption layer is expected to be a highly sensitive light receiving element which may operate at high speed. However, in a part of a C band having a wavelength range of 1530 nm to 1565 nm, a sufficient optical sensitivity may not be obtained. Therefore, there has been proposed an optical semiconductor element in which a heater for heating a Ge layer is monolithically integrated in order to increase a light absorption coefficient.

However, in the optical semiconductor element of the related art, the characteristics, for example increasing dark currents and decreasing frequency responses (about −3 dB), adversely deteriorate due to heating by the heater.

Japanese Laid-open Patent Publication No. 2018-74104, Japanese Laid-open Patent Publication No. 2017-152434, and Japanese Laid-open Patent Publication No. 2000-174397 are examples of related art.

SUMMARY

According to an aspect of the embodiments, an optical semiconductor element includes an optical receiver including a first semiconductor layer that absorbs light and generates electric carriers; a heater for heating the first semiconductor layer; and a monitor including a second semiconductor layer in which dark current is changed by heat generated by the heater.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described in detail with reference to accompanying drawings. In the specification and drawings, elements having substantially the same functional configuration may be denoted by the same reference signs and redundant description thereof may be omitted. In the present disclosure, an X1-X2 direction, a Y1-Y2 direction, and a Z1-Z2 direction are perpendicular to one another. For convenience, the Z1-Z2 direction is assumed to be the vertical direction. In a plan view, an object is viewed from the Z1 side.

First Embodiment

Figure 1:
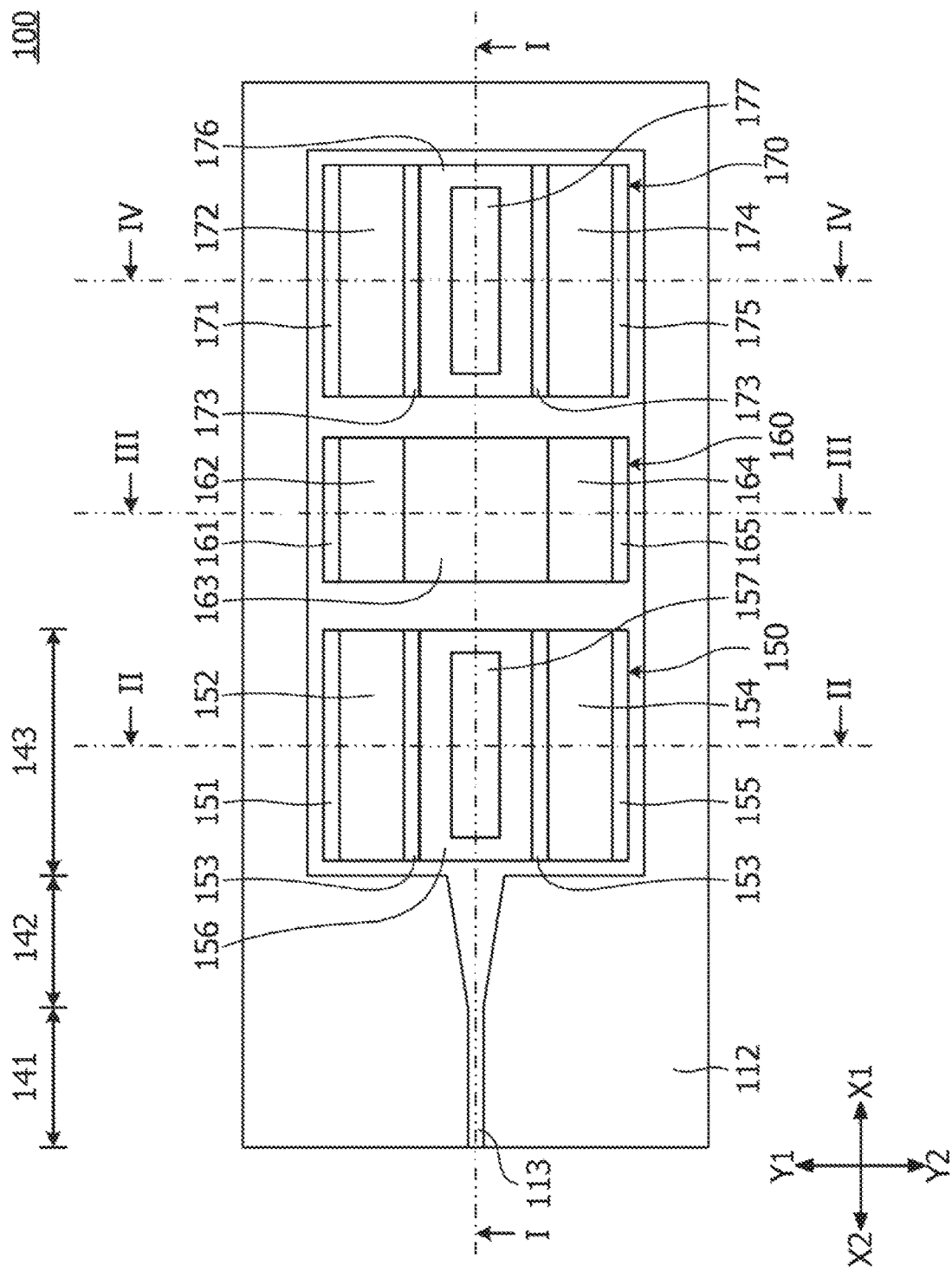
FIG. 1 is a view illustrating a layout of a region of a semiconductor included in an optical semiconductor element according to a first embodiment.
Figure 2:
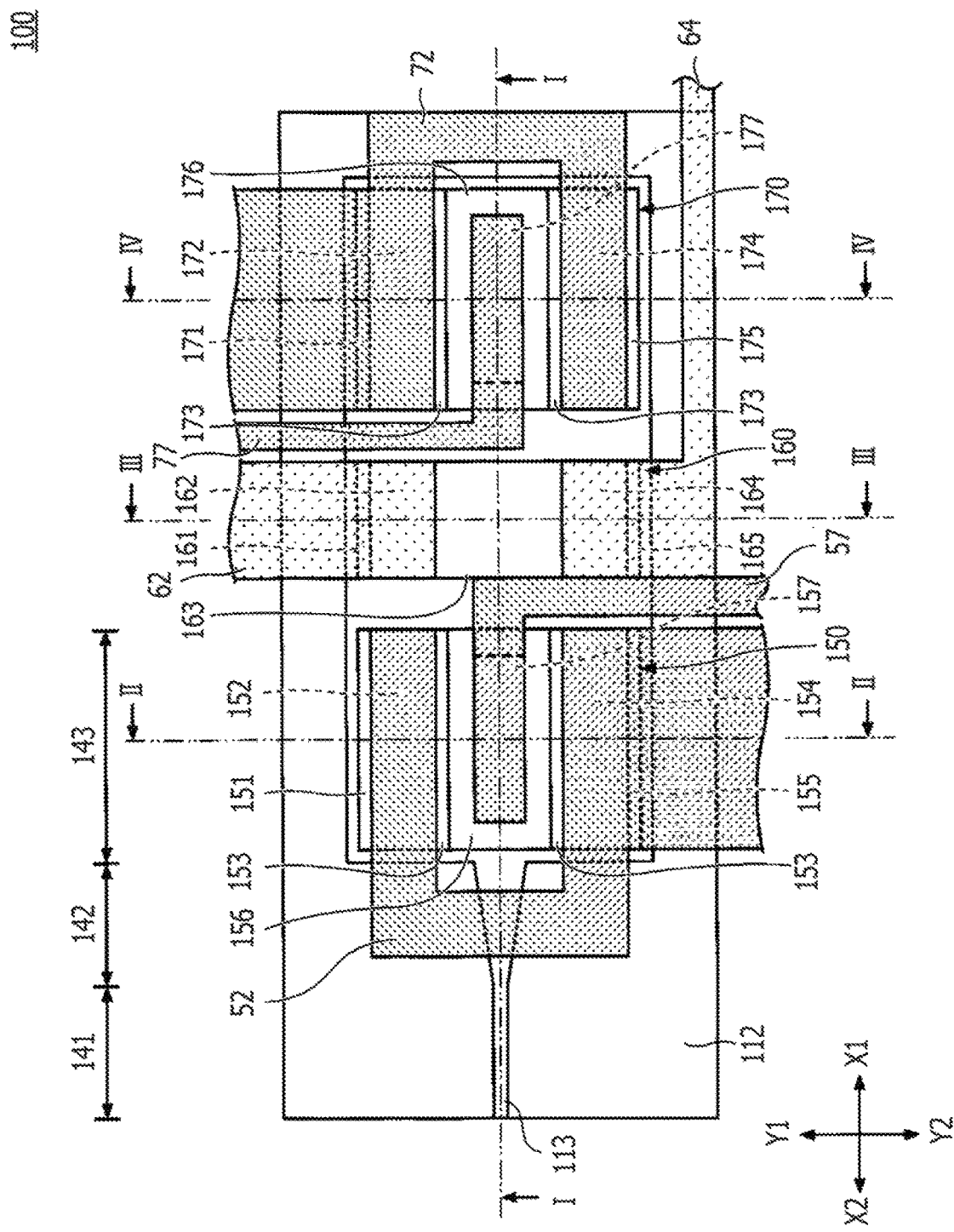
FIG. 2 is a view illustrating a layout of a region and a metal wiring of a semiconductor included in the optical semiconductor element according to the first embodiment.
Figure 3:
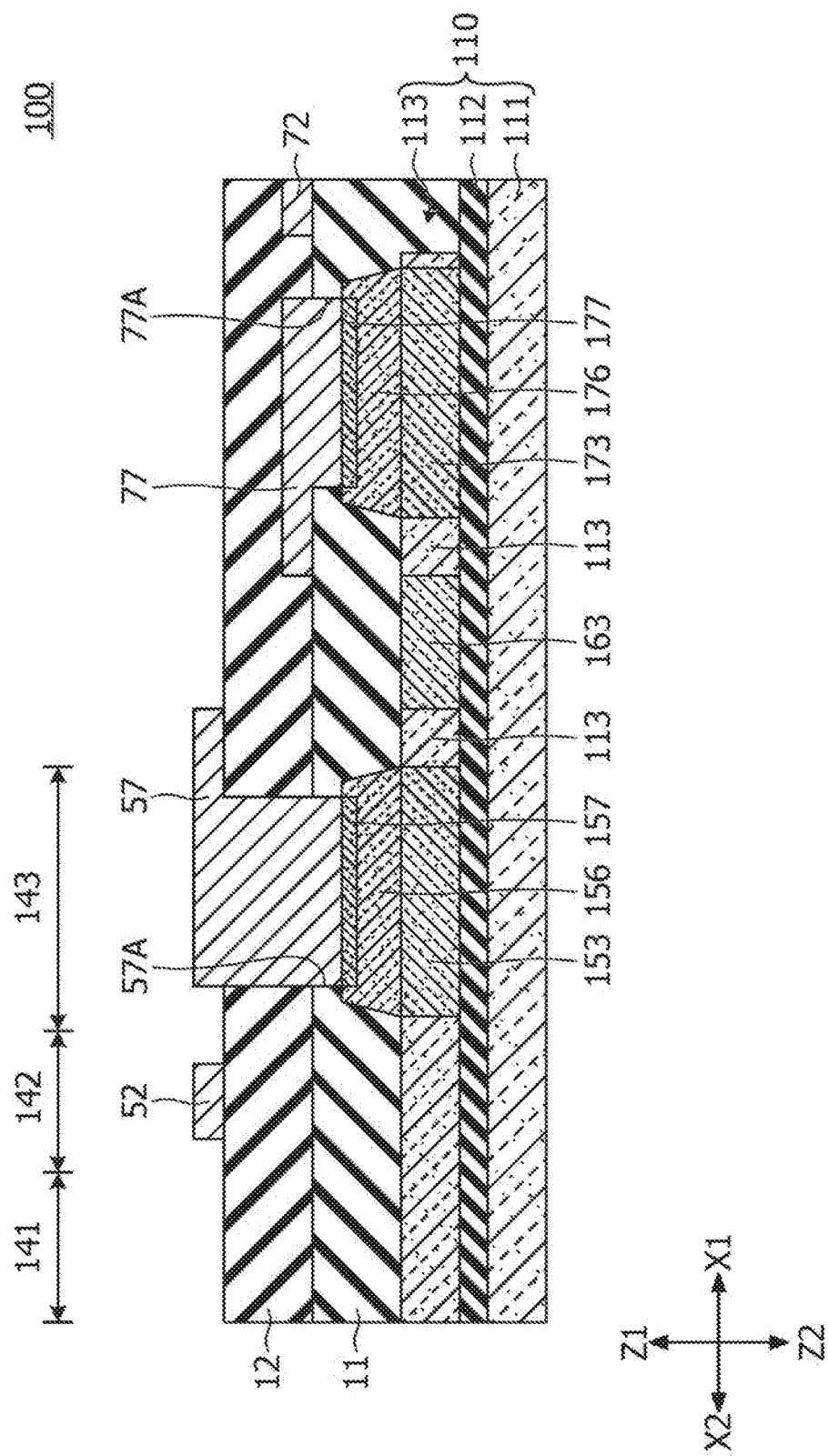
FIG. 3 is a cross-sectional view (part 1) illustrating a configuration of the optical semiconductor element according to the first embodiment.
Figure 4:
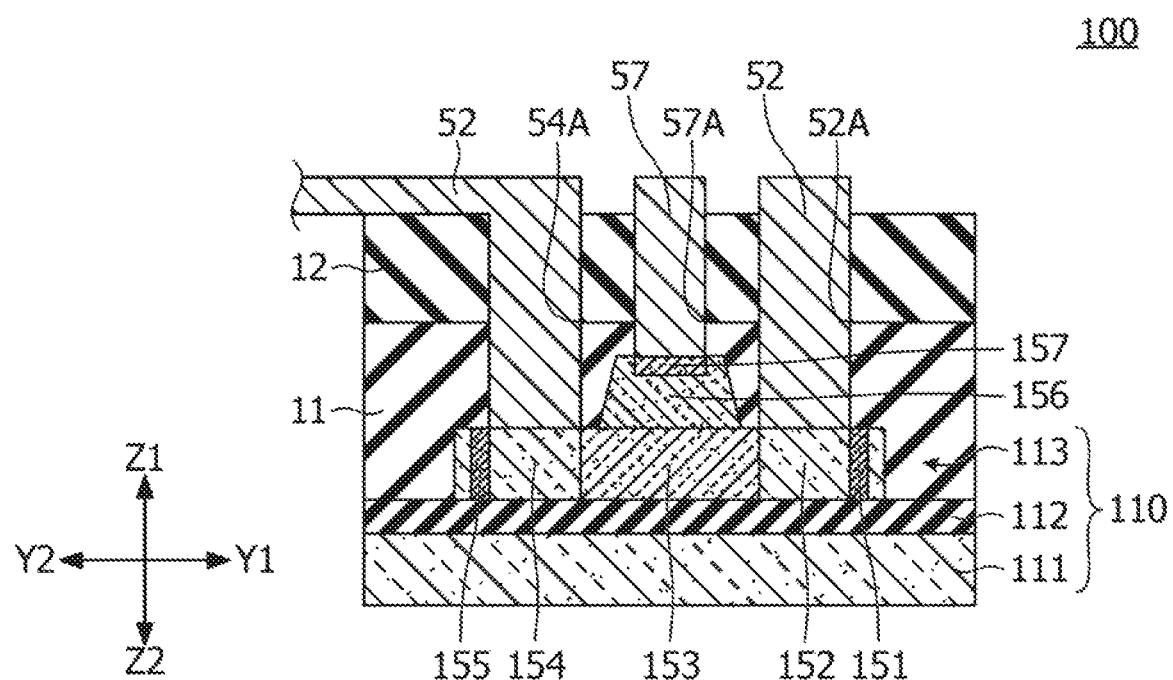
FIG. 4 is a cross-sectional view (part 2) illustrating the configuration of the optical semiconductor element according to the first embodiment.
Figure 5:
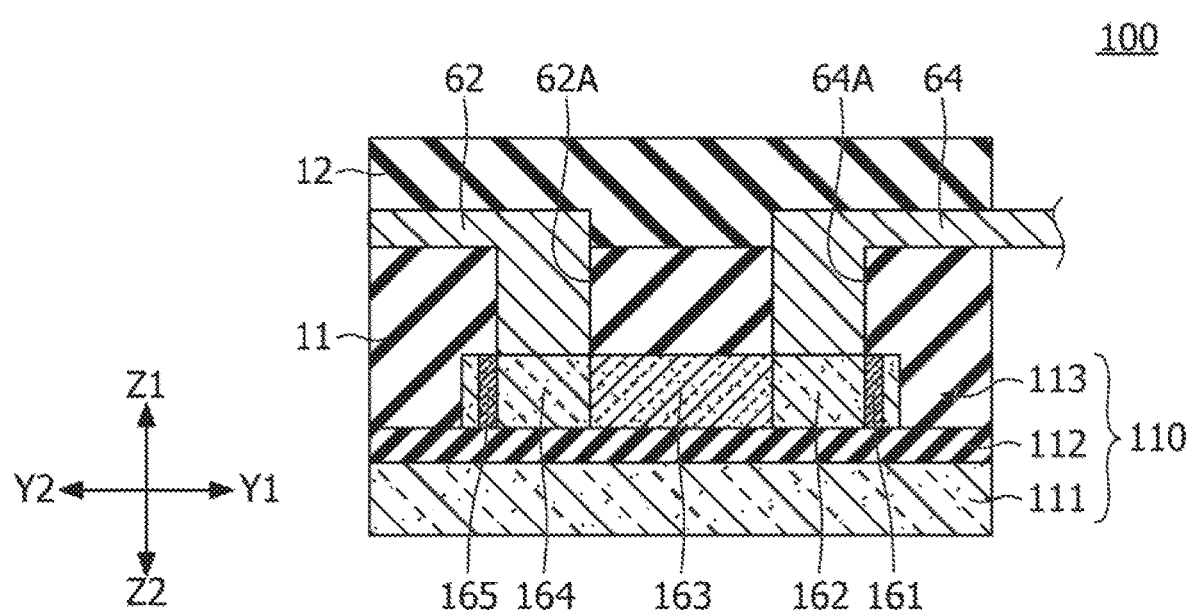
FIG. 5 is a cross-sectional view (part 3) illustrating the configuration of the optical semiconductor element according to the first embodiment.
Figure 6:
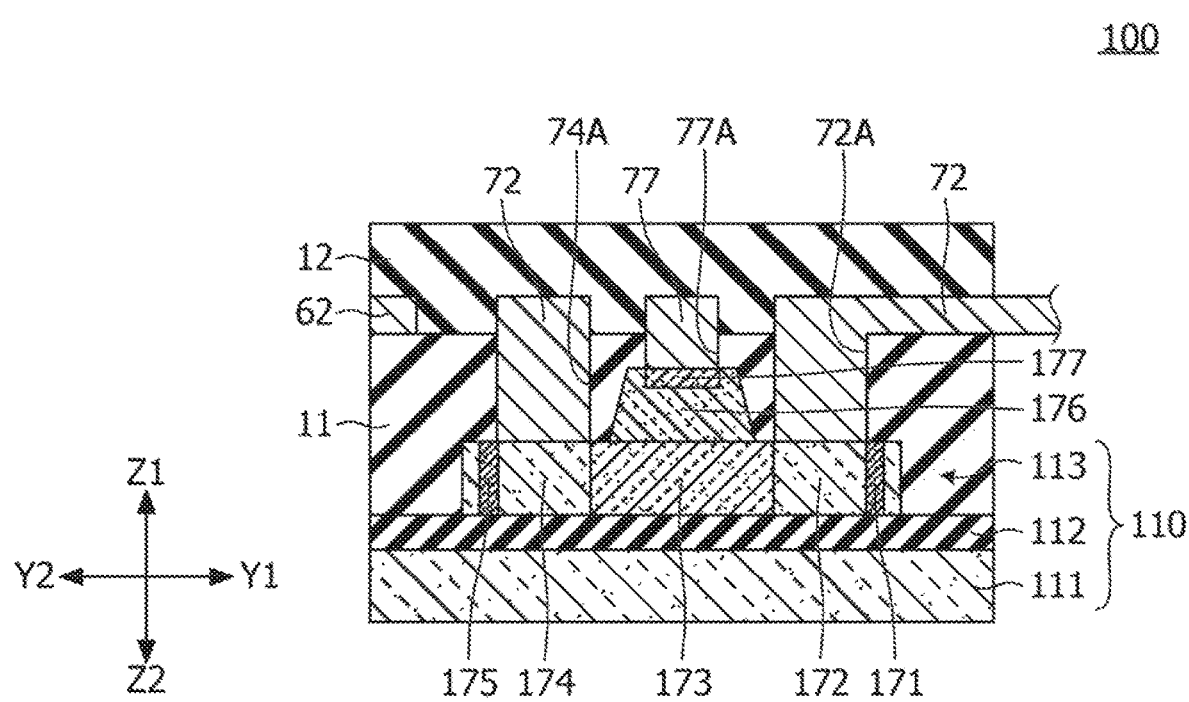
FIG. 6 is a cross-sectional view (part 4) illustrating the configuration of the optical semiconductor element according to the first embodiment.

First, a first embodiment is described. The first embodiment relates to an optical semiconductor element. FIG. 1 is a view illustrating a layout of a region of a semiconductor included in an optical semiconductor element according to the first embodiment. FIG. 2 is a view illustrating a layout of a region and a metal wiring of the semiconductor included in the optical semiconductor element according to the first embodiment. FIGS. 3 to 6 are cross-sectional views illustrating a configuration of the optical semiconductor element according to the first embodiment. FIG. 3 corresponds to a cross-sectional view taken along a line I-I in FIGS. 1 and 2. FIG. 4 corresponds to a cross-sectional view taken along line I-II in FIGS. 1 and 2. FIG. 5 corresponds to a cross-sectional view taken along line III-III in FIGS. 1 and 2. FIG. 6 corresponds to a cross-sectional view taken along line IV-IV in FIGS. 1 and 2.

As illustrated in FIGS. 1 to 6, an optical semiconductor element 100 according to the first embodiment includes a SOI substrate 110 including a silicon (Si) substrate 111, a Si oxide film 112, and a Si layer 113. The optical semiconductor element 100 includes a waveguide region 141 of the Si layer 113, a mode converter 142 of the Si layer 113, and a photoelectric converter 143 of the Si layer 113. In the waveguide region 141, the Si layer 113 is processed into a shape of an optical waveguide. In the mode converter 142, the Si layer 113 is processed into a shape of an optical mode converter. The waveguide region 141, the mode converter 142, and the photoelectric converter 143 are arranged in this order from the X2 side to the X1 side, and an optical signal propagates from the X2 side toward the X1 side. The waveguide region 141, the mode converter 142, and the photoelectric converter 143 are monolithically integrated in the SOI substrate 110.

In the photoelectric converter 143, for example, the Si layer 113 is processed into a rectangular planar shape. The photoelectric converter 143 includes an optical receiver 150, a heater 160, and a monitor 170. The optical receiver 150, the heater 160, and the monitor 170 are arranged in this order from the X2 side toward the X1 side.

In the optical receiver 150, the Si layer 113 includes a p⁻Si region 151, a p⁺Si region 152, a psi region 153, a p⁺Si region 154, and a p⁻Si region 155. The p⁻Si region 151, the p⁺Si region 152, the p⁻Si region 153, the p⁺Si region 154, and the p⁻-Si region 155 are arranged in this order from the Y1 side toward the Y2 side. For example, the p⁻Si region 151, the p⁺Si region 152, the p⁻Si region 153, the p⁺Si region 154, and the p⁻Si region 155 are arranged in this order in the direction perpendicular to the incident direction of light to the optical receiver 150. The p⁺Si region 152 and the p⁺Si region 154 contain a p-type impurity, for example, boron at a higher concentration than the p⁻Si region 151, the p⁻Si region 153, and the p⁻Si region 155. The Si layer 113 is an example of a third semiconductor layer.

An i-type germanium (Ge) layer 156 is formed over the p⁻Si region 153, and an n⁺Ge region 157 is formed on the surface of the i-type Ge layer 156. The bandgap of the i-type Ge layer 156 is smaller than the bandgap of the Si layer 113. The refractive index and light absorption coefficient of the i-type Ge layer 156 are larger than the refractive index and light absorption coefficient of the Si layer 113. The i-type Ge layer 156 is an example of a first semiconductor layer (a light absorption layer).

In the heater 160, the Si layer 113 includes a p⁻Si region 161, a p⁺Si region 162, a p⁻Si region 163, a p⁺Si region 164, and a p⁻Si region 165. The p⁻Si region 161, the p⁺Si region 162, the p⁻Si region 163, the p⁺Si region 164, and the p⁻Si region 165 are arranged in this order from the Y1 side toward the Y2 side. For example, the p⁻Si region 161, the p⁺Si region 162, the p⁻Si region 163, the p⁺Si region 164, and the p⁻Si region 165 are arranged in this order in the direction perpendicular to the incident direction of light to the optical receiver 150. The p-Si region 163 is positioned on the X1 side of the i-type Ge layer 156 in a plan view. The p⁺Si region 162 and the p⁺Si region 164 contain a p-type impurity, for example, boron at a higher concentration than the p⁻Si region 161, the p⁻Si region 163, and the p⁻Si region 165.

In the monitor 170, the Si layer 113 includes a p⁻Si region 171, a p⁺Si region 172, a p⁻Si region 173, a p⁺Si region 174, and a p⁻Si region 175. The p⁻Si region 171, the p⁺Si region 172, the p⁻Si region 173, the p⁺Si region 174, and the psi region 175 are arranged in this order from the Y1 side toward the Y2 side. For example, the p⁻Si region 171, the p⁺Si region 172, the p⁻Si region 173, the p⁺Si region 174, and the p⁻Si region 175 are arranged in this order in the direction perpendicular to the incident direction of light to the optical receiver 150. The p⁺Si region 172 and the p⁺Si region 174 contain a p-type impurity, for example, boron at a higher concentration than the p⁻Si region 171, the p⁻Si region 173, and the p⁻Si region 175.

An i-type Ge layer 176 is formed over the psi region 173, and an n⁺Ge region 177 is formed on the surface of the i-type Ge layer 176. The bandgap of the i-type Ge layer 176 is smaller than the bandgap of the Si layer 113. The refractive index and light absorption coefficient of the i-type Ge layer 176 are larger than the refractive index and light absorption coefficient of the Si layer 113. The i-type Ge layer 176 is an example of a second semiconductor layer.

For example, the i-type Ge layer 176 preferably has a plane-symmetric structure with respect to the i-type Ge layer 156 with the heater 160 as the axis of symmetry in the X1-X2 direction. The heater 160 is preferably positioned at the center between the i-type Ge layer 156 and the i-type Ge layer 176. The i-type Ge layer 176 is preferably made of the same material as the i-type Ge layer 156, and the n$^+$Ge region 177 is preferably made of the same material as the n$^+$Ge region 157 and contains the same amount of impurities. This is because the temperature of the i-type Ge layer 156 and the temperature of the i-type Ge layer 176 are increased to be equal to each other by the heater 160.

Even in a case where there is no strict plane symmetry, it is preferable that the degree of symmetry is such that a correlation between the optical receiver 150 and the monitor 170 may be confirmed by the temperature increase caused by the heater 160 from the value numerically analyzed by the 3D simulation or the like.

For example, the p$^-$Si region 171, the p$^+$Si region 172, the p$^-$Si region 173, the p$^+$Si region 174, and the p$^-$Si region 175 have a plane-symmetric structure with respect to the p$^-$Si region 151, the p$^+$Si region 152, the p$^-$Si region 153, the p$^+$Si region 154, and the p$^-$Si region 155 with the heater 160 as a symmetric axis in the X1-X2 direction. The p$^-$Si region 151 and the p$^-$Si region 171 may be made of the same material and contain the same amount of impurities. The p$^+$Si region 152 and the p$^+$Si region 172 may be made of the same material and contain the same amount of impurities. The p$^-$Si region 153 and the p$^-$Si region 173 may be made of the same material and contain the same amount of impurities. The p$^+$Si region 154 and the p$^+$Si region 174 may be made of the same material and contain the same amount of impurities. The p$^-$Si region 155 and the p$^-$Si region 175 may be made of the same material and contain the same amount of impurities.

A Si oxide film 11 is formed to cover the Si layer 113, the i-type Ge layer 176 including and an n$^+$Ge region 157, and the i-type Ge layer 156 including the n$^+$Ge region 177. An opening portion 64A reaching the p$^+$Si region 162 and an opening portion 62A reaching the p$^+$Si region 164 are formed in the Si oxide film 11. A metal wiring 62 in ohmic contact with the p$^+$Si region 162 through the opening portion 62A and a metal wiring 64 in ohmic contact with the p$^+$Si region 164 through the opening portion 64A are formed over the Si oxide film 11. The metal wiring 62 and the metal wiring 64 include aluminum (Al), for example. The metal wiring 62 functions as a first heater electrode, and the metal wiring 64 functions as a second heater electrode.

Further, an opening portion 72A reaching the p$^+$Si region 172, an opening portion 74A reaching the p$^+$Si region 174, and an opening portion 77A reaching the n$^+$Ge region 177 are formed in the Si oxide film 11. A metal wiring 72 which is in ohmic contact with the p$^+$Si region 172 through the opening portion 72A and is ohmic contacts the p$^+$Si region 174 through the opening portion 74A is formed over the Si oxide film 11. A metal wiring 77 in ohmic contact with the n$^+$Ge region 177 through the opening portion 77A is formed over the Si oxide film 11. The metal wiring 72 and the metal wiring 77 include Al, for example. The metal wiring 72 functions as a first monitor electrode. The metal wiring 77 functions as a second monitor electrode.

A Si oxide film 12 is formed over the Si oxide film 11. An opening portion 52A reaching the p$^+$Si region 152, an opening portion 54A reaching the p$^+$Si region 154, and an opening portion 57A reaching the n$^+$Ge region 157 are formed in the Si oxide films 11 and 12. A metal wiring 52 which is ohmic contact with the p$^+$Si region 152 through the opening portion 52A and is ohmic contacted with the p$^+$Si region 154 through the opening portion 54A is formed over the Si oxide film 12. A metal wiring 57 in ohmic contact with the n$^+$Ge region 157 through the opening portion 57A is formed over the Si oxide film 12. The metal wiring 52 and the metal wiring 57 include Al, for example. The metal wiring 52 functions as a p-side electrode of a PIN type photodiode (PD). The metal wiring 57 functions as an n-side electrode of the PIN type PD.

A reverse bias of, for example, about −3 V to −2 V is applied to the optical receiver 150. For example, a voltage higher than a voltage of the metal wiring 52 by about 2 V to 3 V is applied to the metal wiring 57. When the light propagating through the waveguide region 141 and subjected to mode conversion by the mode converter 142 enters the optical receiver 150, the i-type Ge layer 156 absorbs light and generates electric carriers. Among the electric carriers generated in the i-type Ge layer 156, electrons are taken out from the metal wiring 57 through the p$^+$Si regions 152 and 154, and holes are taken out from the metal wiring 52 through the n$^+$Ge region 157.

In the heater 160, the p$^-$Si region 163 functions as a heater and generates heat in accordance with a potential difference between the metal wiring 62 and the metal wiring 64. The amount of heat generated in the p$^-$Si region 163 increases as the potential difference increases.

In the monitor 170, dark current corresponding to the temperature of the i-type Ge layer 176 flows. The dark current increases as the temperature of the i-type Ge layer 176 increases. The current leaks between the metal wiring 72 and the metal wiring 77.

Figure 7:
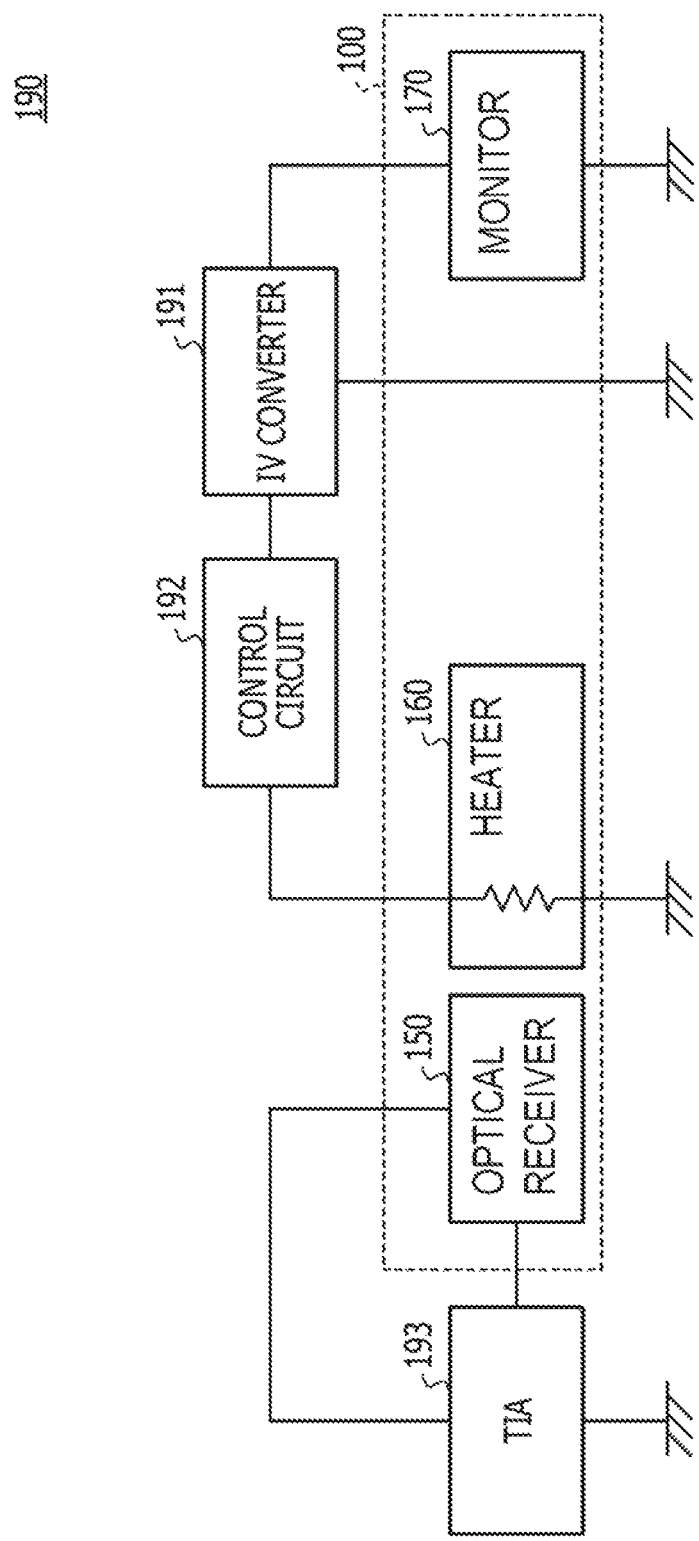
FIG. 7 is a block view illustrating a configuration of an optical semiconductor device including the optical semiconductor element according to the first embodiment.

An optical semiconductor device provided with the optical semiconductor element 100 according to the first embodiment will now be described. FIG. 7 is a block view illustrating a configuration of an optical semiconductor device including the optical semiconductor element 100 according to the first embodiment.

As illustrated in FIG. 7, an optical semiconductor device 190 includes the optical semiconductor element 100 having the optical receiver 150, the heater 160, and the monitor 170. The optical semiconductor device 190 further includes a current-to-voltage converter (IV converter) 191, a control circuit 192, and a transimpedance amplifier (TIA) 193.

The IV converter 191 is coupled to the n$^+$Ge region 177 of the monitor 170 through the metal wiring 77. The p$^+$Si regions 172 and 174 of the monitor 170 are grounded through the metal wiring 72. The IV converter 191 converts the dark current generated in the i-type Ge layer 176 into a voltage and outputs the voltage to the control circuit 192.

The control circuit 192 is coupled to the p$^+$Si region 164 of the heater 160 through the metal wiring 64. The p$^+$Si region 162 of the heater 160 is grounded through the metal wiring 62. The control circuit 192 adjusts the voltage applied to the heater 160 in accordance with the voltage supplied from the IV converter 191.

The TIA 193 is coupled to the p$^+$Si regions 152 and 154 of the optical receiver 150 through the metal wiring 52 and is coupled to the n$^+$Ge region 157 of the optical receiver 150 through the metal wiring 57. The TIA 193 detects the amount of electric carriers generated in the i-type Ge layer 156, amplifies the electric carriers, and outputs the detected electric carriers.

Here, the operation of the optical semiconductor device 190 will be described based on a specific example.

Figure 8:
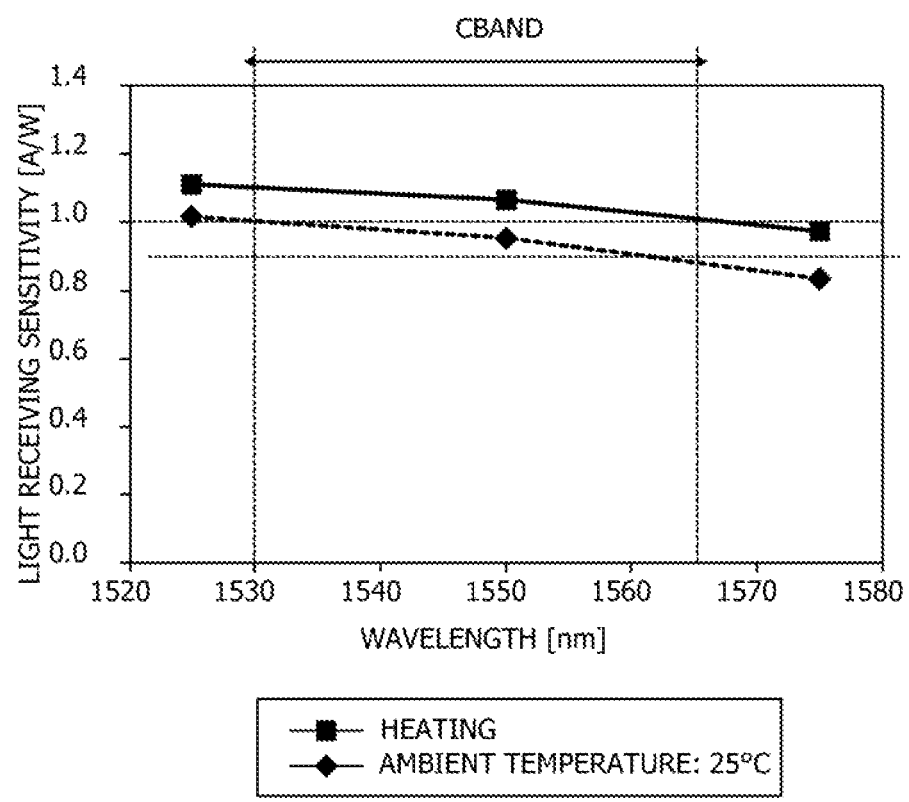
FIG. 8 is a view illustrating a relationship between a wavelength and an optical sensitivity of the optical semiconductor element.

FIG. 8 is a view illustrating a relationship between a wavelength and an optical sensitivity of the optical semiconductor element 100. The wavelength of the fundamental absorption at the r point of Ge is about 1550 nm, and the light absorption coefficient is smaller toward the longer wavelength side. For example, in a case where the ambient temperature is 25° C., as illustrated in FIG. 8, the optical sensitivity is 0.9 A/W or less at a C band end on the long wavelength side. In such a case, the absorption edge of the i-type Ge layer 156 may be shifted to the long wavelength side by heating the i-type Ge layer 156 to about 50° C. to 65° C. by the heater 160. As a result, as illustrated in FIG. 8, the optical sensitivity at the C band end on the long wavelength side may be set to 1.0 A/W or more. When the heater 160 heats the i-type Ge layer 156, the i-type Ge layer 176 of the monitor 170 is heated to the same extent. For example, when the temperature of the i-type Ge layer 156 is 50° C. to 65° C., the temperature of the i-type Ge layer 176 is also 50° C. to 65C. The higher the symmetry between the i-type Ge layer 156 and the i-type Ge layer 176 with the heater 160 as an axis, the more the temperature of the i-type Ge layer 156 and the temperature of the i-type Ge layer 176 are increased to be equal to each other.

Figure 9:
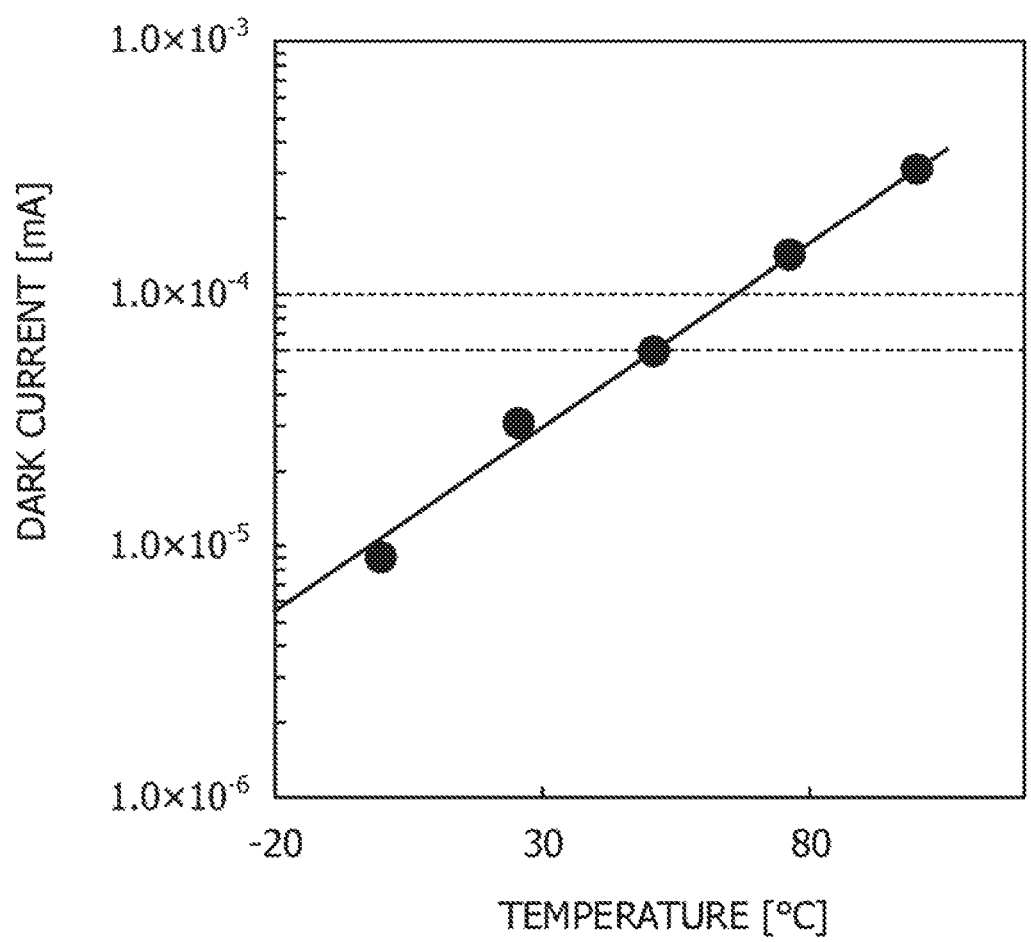
FIG. 9 is a view illustrating a relationship between a temperature of an i-type Ge layer and dark current.

FIG. 9 is a view illustrating the relationship between the temperature of the i-type Ge layer 176 and the dark current. As illustrated in FIG. 9, the dark current is larger as the temperature of the i-type Ge layer 176 is higher. In this example, when the temperature of the i-type Ge layer 176 is about 50° C. to 65° C., the dark current is about $5 \times 10^{-5}$ mA to $10 \times 10^{-5}$ mA. Therefore, even if the temperature of the i-type Ge layer 156 may not be directly measured, if the heater 160 is controlled so that the dark current becomes approximately $5 \times 10^{-5}$ mA to $10 \times 10^{-5}$ mA, the optical sensitivity may be set to 1.0 A/W or more on the C band end on the long wavelength side regardless of the ambient temperature.

Figure 10:
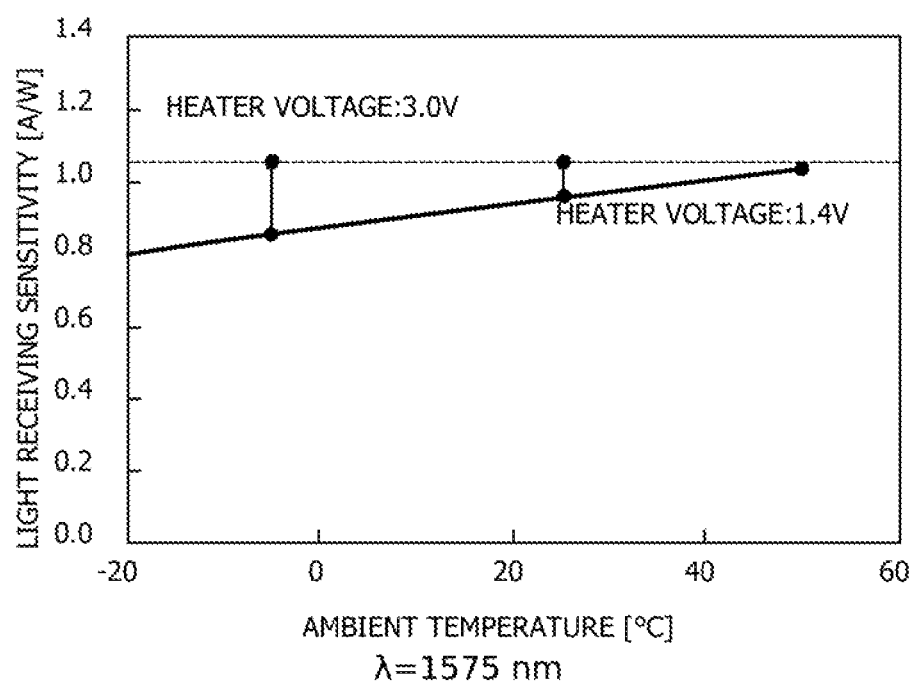
FIG. 10 is a view illustrating a relationship between an ambient temperature and an optical sensitivity of light having a wavelength of 1575 nm.

FIG. 10 is a view illustrating a relationship between an ambient temperature and an optical sensitivity of light having a wavelength of 1575 nm.

In a case where the ambient temperature is −5° C., as illustrated in FIG. 9, the dark current in the initial state is about $1 \times 10^{-5}$ mA, and as illustrated in FIG. 10, the optical sensitivity of light having a wavelength of 1575 nm is about 0.8 A/W. In this case, the control circuit 192 controls the heater 160 so that the dark current is approximately $5 \times 10^{-5}$ mA to $10 \times 10^{-5}$ mA. In this specific example, for example, a potential difference (heater voltage) between the metal wiring 62 and the metal wiring 64 is set to 3.0 V. As a result, the dark current is about $5 \times 10^{-5}$ mA to $10 \times 10^{-5}$ mA, and the optical sensitivity of the light having a wavelength of 1575 nm is about 1.05 A/W. When the optical sensitivity of light having a wavelength of 1575 nm is about 1.05 A/W, an appropriate optical sensitivity may be obtained in the entire C band.

In a case where the ambient temperature is 25° C., as illustrated in FIG. 9, the dark current in the initial state is about $3 \times 10^{-5}$ mA, and as illustrated in FIG. 10, the optical sensitivity of light having a wavelength of 1575 nm is about 0.92 A/W. In this case as well, the control circuit 192 controls the heater 160 so that the dark current is approximately $5 \times 10^{-5}$ mA to $10 \times 10^{-5}$ mA. In this specific example, for example, a potential difference (heater voltage) between the metal wiring 62 and the metal wiring 64 is set to 1.4 V. As a result, the dark current is about $5 \times 10^{-5}$ mA to $10 \times 10^{-5}$ mA, and the optical sensitivity of the light having a wavelength of 1575 nm is about 1.05 A/W. When the light receiving sensitivity of light having a wavelength of 1575 nm is about 1.05 A/W, an appropriate optical sensitivity may be obtained in the entire C band.

In a case where the ambient temperature is 65° C. or more, as illustrated in FIG. 9, the dark current in the initial state is $10 \times 10^{-5}$ mA or more, and the optical sensitivity of light having a wavelength of 1575 nm is 1.0 A/W or more (not illustrated in FIG. 10). In this case, the control circuit 192 does not operate the heater 160 and does not perform the intentional heating of the i-type Ge layer 156. In this specific example, for example, a potential difference (heater voltage) between the metal wiring 62 and the metal wiring 64 is set to 0 V. As a result, the dark current is maintained at $10 \times 10^{-5}$ mA or more, and the optical sensitivity of light having a wavelength of 1575 nm is maintained at 1.0 A/W or more. When the temperature of the i-type Ge layer 156 is too high, for example, 85° C. or more, deterioration in element characteristics such as an increased dark current and a decrease in response speed may occur, and in the present embodiment, operation in a preferable temperature range including an optimum temperature of the i-type Ge layer 156 may be performed, and excellent characteristics may be maintained.

According to the first embodiment, under an ambient temperature where a sufficient optical sensitivity may not be obtained in a part of the C band, appropriate power is applied to the heater 160 to appropriately raise the temperature of the i-type Ge layer 156 to obtain a sufficient optical sensitivity in the entire C band. Under an ambient temperature at which sufficient optical sensitivity is obtained in the entire C band, it is possible to operate in a preferable temperature range including the optimum temperature while obtaining sufficient optical sensitivity in the entire C band, thereby maintaining good characteristics.

Instead of the optical semiconductor element 100 included in the optical semiconductor device 190, an optical semiconductor element according to a modification example or an embodiment described below may be used.

Although the i-type semiconductor is not intentionally doped with an impurity, the i-type semiconductor may contain a slight impurity, for example, an impurity having a concentration of $1 \times 10^{15}$ cm$^{-3}$ or less. For example, the i-type Ge layer 156 and the i-type Ge layer 176 may contain an impurity having a concentration of $1 \times 10^{15}$ cm$^{-3}$ or less.

Modification Example of First Embodiment

Figure 11:
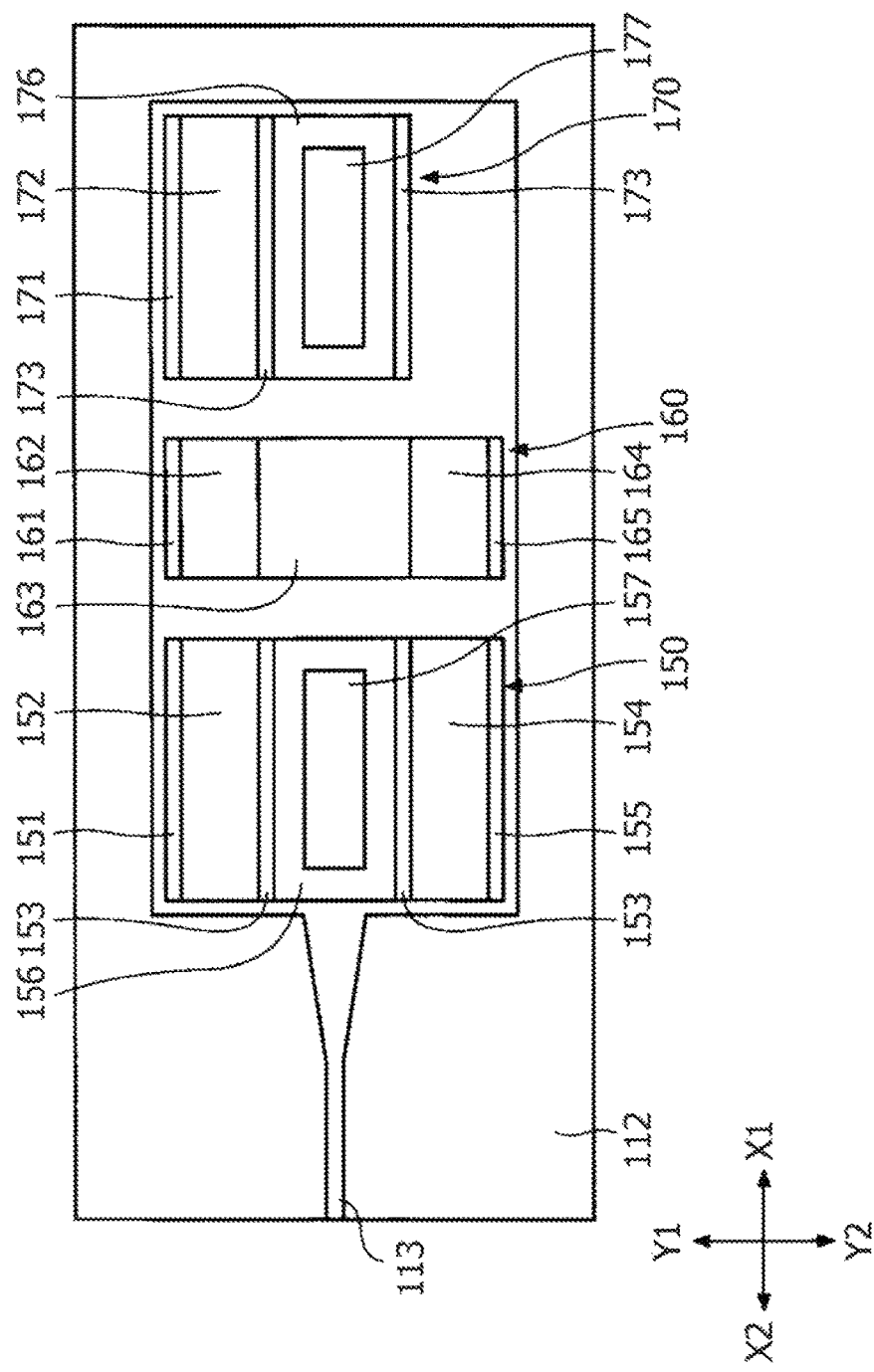
FIG. 11 is a view illustrating a layout of a region of a semiconductor included in an optical semiconductor element according to a modification example of the first embodiment.
Figure 12:
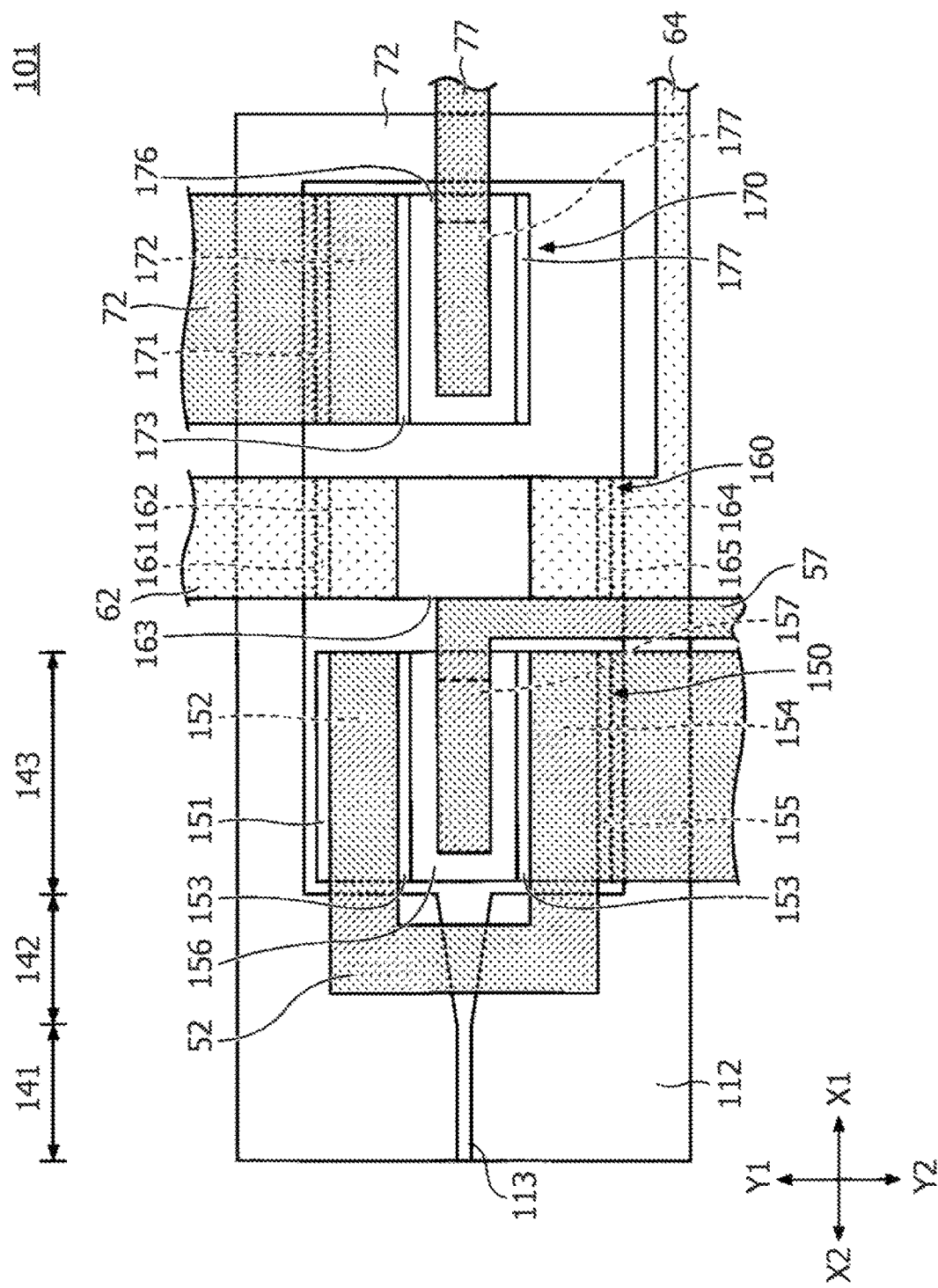
FIG. 12 is a view illustrating a layout of a region and a metal wiring of a semiconductor included in the optical semiconductor element according to the modification example of the first embodiment.

Next, a modification example of the first embodiment will be described. The modification example is different from the first embodiment in terms of the configuration of the monitor 170. FIG. 11 is a view illustrating a layout of a region of a semiconductor included in an optical semiconductor element according to a modification example of the first embodiment. FIG. 12 is a view illustrating a layout of a region and a metal wiring of a semiconductor included in the optical semiconductor element according to the modification example of the first embodiment.

In the optical semiconductor element 101 according to the modification example of the first embodiment, as illustrated in FIGS. 11 and 12, the Si layer 113 of the monitor 170 includes the p⁻Si region 171, the p⁺Si region 172, and the p⁻Si region 173 and does not include the p⁺Si region 174 and the p⁻Si region 175. The p⁻Si region 171, the p⁺Si region 172, and the p⁻Si region 173 are arranged in this order from the Y1 side toward the Y2 side. For example, the p⁻Si region 171, the p⁺Si region 172, and the p⁻Si region 173 are arranged in this order in the direction perpendicular to the incident direction of light to the optical receiver 150. The opening portions 54A are not formed in the Si oxide films 11 and 12, and the metal wiring 72 is in ohmic contact with the p+Si region 172 through the opening portions 72A. The other elements are the same as in the first embodiment.

In the modification example as well, the same control as that in the first embodiment may be performed based on the dark current generated in the i-type Ge layer 176. Therefore, the same effects as those of the first embodiment may be obtained. The configuration of the monitor 170 may be simplified.

Second Embodiment

Figure 13:
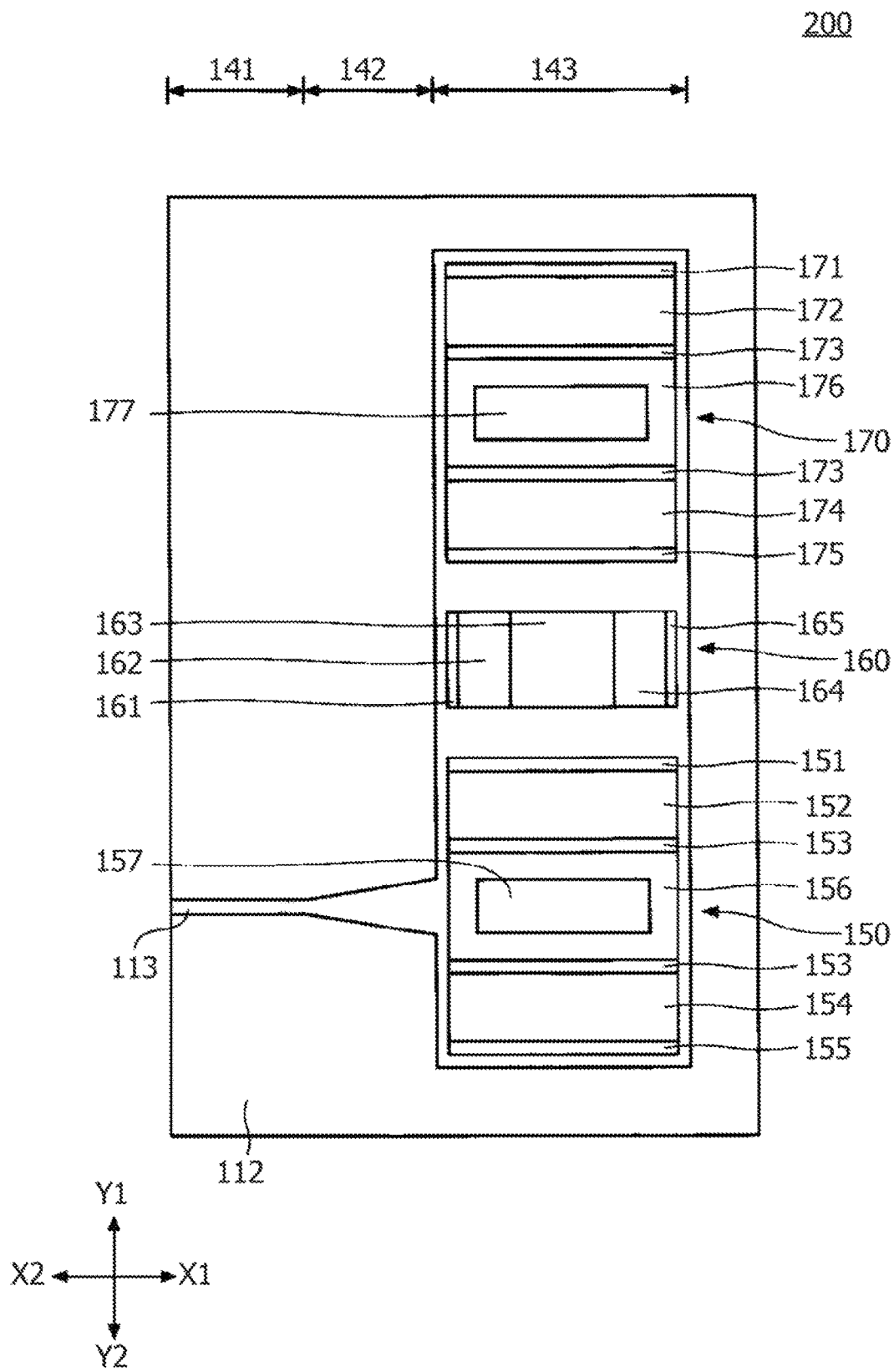
FIG. 13 is a view illustrating a layout of a region of a semiconductor included in an optical semiconductor element according to a second embodiment.
Figure 14:
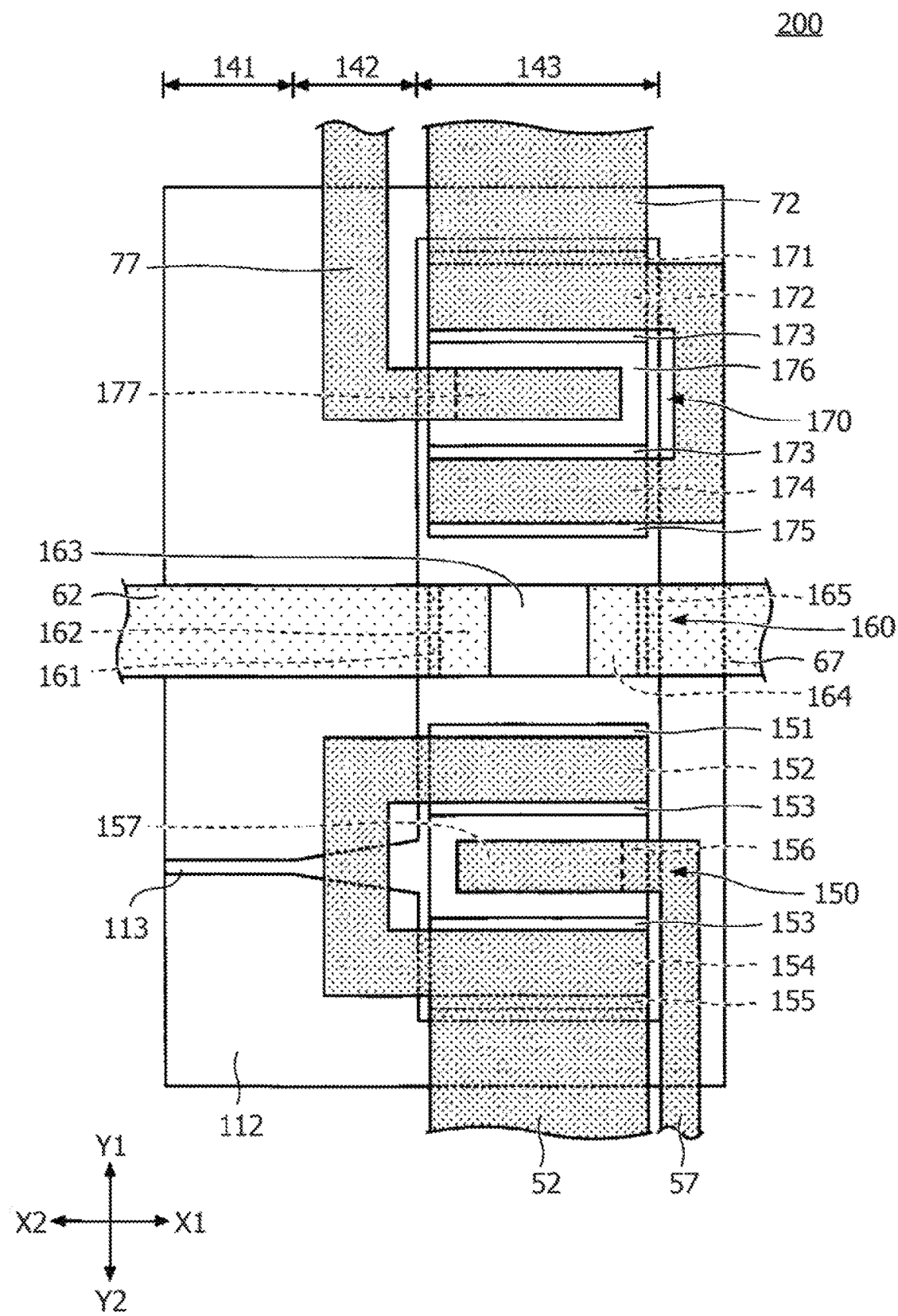
FIG. 14 is a view illustrating a layout of a region and a metal wiring of the semiconductor included in the optical semiconductor element according to the second embodiment.

Next, a second embodiment is described. The second embodiment is different from the first embodiment in terms of the arrangement of the monitor 170. FIG. 13 is a view illustrating a layout of a region of a semiconductor included in an optical semiconductor element according to the second embodiment. FIG. 14 is a view illustrating a layout of a region and a metal wiring of the semiconductor included in the optical semiconductor element according to the second embodiment.

In an optical semiconductor element 200 according to the second embodiment, as illustrated in FIGS. 13 and 14, in the photoelectric converter 143, the optical receiver 150, the heater 160, and the monitor 170 are arranged in this order from the Y2 side toward the Y1 side. In the heater 160, the p−Si region 161, the p+Si region 162, the psi region 163, the p+Si region 164, and the p−Si region 165 are arranged in this order from the X2 side toward the X1 side. The other elements are the same as in the first embodiment.

Also in the second embodiment, the same control as that in the first embodiment may be performed based on the dark current generated in the i-type Ge layer 176 of the monitor 170. Therefore, the same effects as those of the first embodiment may be obtained. In the first embodiment, the monitor 170 is positioned over an extended line of the optical axis of the waveguide region 141, while in the second embodiment, the monitor 170 is disposed so as to be shifted from the extended line of the optical axis of the waveguide region 141. Therefore, even if light which has not been absorbed by the optical receiver 150 is present, since the i-type Ge layer 176 is not present over the optical axis in consideration of the traveling direction of light, it is possible to avoid the signal light from being absorbed at the monitor 170.

In the second embodiment, similarly to the modification example of the first embodiment, the p+Si region 174, the p−Si region 175, and the like may not be formed. In this case as well, it is preferable that the temperature of the i-type Ge layer 156 and the temperature of the i-type Ge layer 176 are increased to be equal to each other by the heater 160.

Third Embodiment

Figure 15:
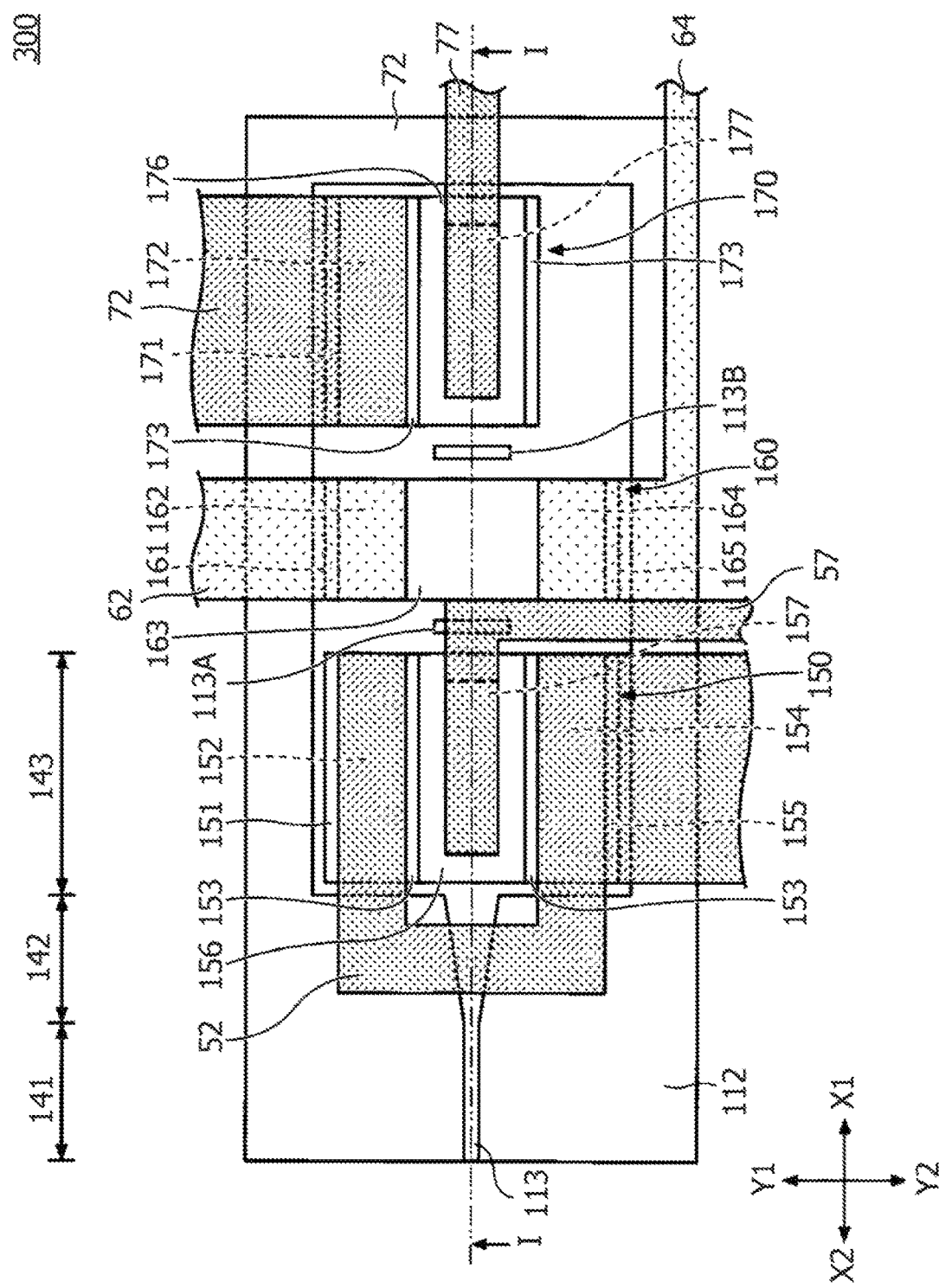
FIG. 15 is a view illustrating a layout of a region and a metal wiring of a semiconductor included in an optical semiconductor element according to a third embodiment.
Figure 16:
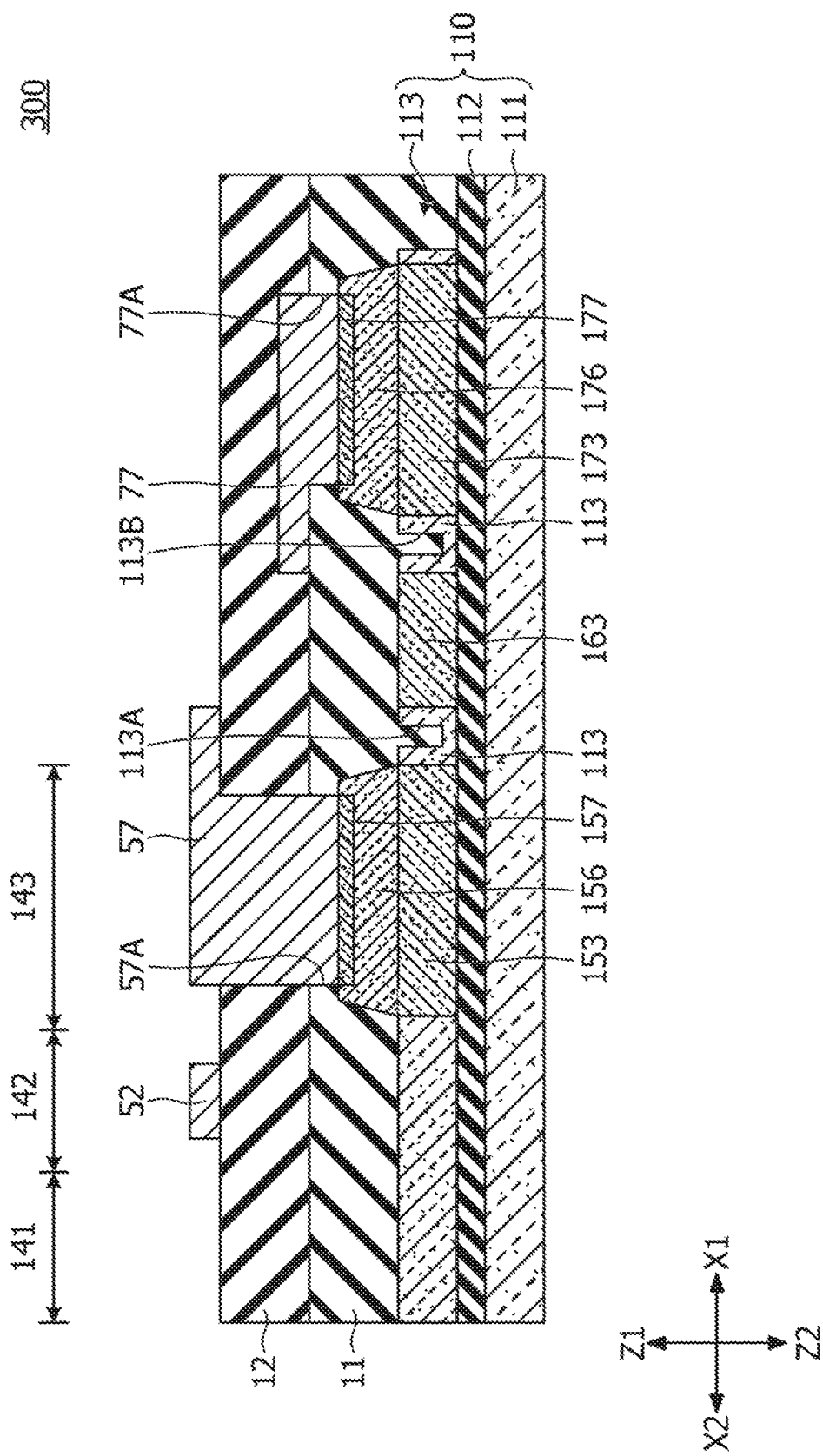
FIG. 16 is a cross-sectional view illustrating a configuration of an optical semiconductor element according to a third embodiment.

Next, a third embodiment is described. The third embodiment is different from the first embodiment in that slits are formed between the optical receiver 150 and the heater 160 and between the heater 160 and the monitor 170. FIG. 15 is a view illustrating a layout of a region and a metal wiring of a semiconductor included in an optical semiconductor element according to the third embodiment. FIG. 16 is a cross-sectional view illustrating a configuration of an optical semiconductor element according to the third embodiment. FIG. 16 corresponds to a cross-sectional view taken along a line I-I in FIG. 15.

In the optical semiconductor element 300 according to the third embodiment, as illustrated in FIGS. 15 and 16, a slit 113A extending in the Y1-Y2 direction between the optical receiver 150 and the heater 160 and a slit 113B extending in the Y1-Y2 direction between the heater 160 and the monitor 170 are formed in the Si layer 113. The slits 113A and 113B have dimensions equal to or larger than those of the end portions of the mode converter 142 on the side of the photoelectric converter 143, for example, in the Y1-Y2 direction. The depth of slits 113A and 113B is smaller than the thickness of the Si layer 113. Therefore, the Si layer 113 remains at the bottom of the slits 113A and 113B. The other elements are the same as in the modification example of the first embodiment. The slit 113A is an example of a first barrier, and the slit 113B is an example of a second barrier.

Also in the third embodiment, the same control as that in the first embodiment may be performed based on the dark current generated in the i-type Ge layer 176. Therefore, the same effects as those of the first embodiment may be obtained. Since the slits 113A and 113B are formed in the Si layer 113, even if light which has not been absorbed by the optical receiver 150 is present, it is possible to avoid the light from reaching the i-type Ge layer 176. Further, since the Si layer 113 remains at the bottom of the slits 113A and 113B, heat generated in the heater 160 through the Si layer 113 is easily transmitted to the i-type Ge layers 156 and 176.

For example, the slit 113B preferably has a plane-symmetric structure with respect to the slit 113A in the X1-X2 direction with the heater 160 as the axis of symmetry.

Modification Example of Third Embodiment

Figure 17:
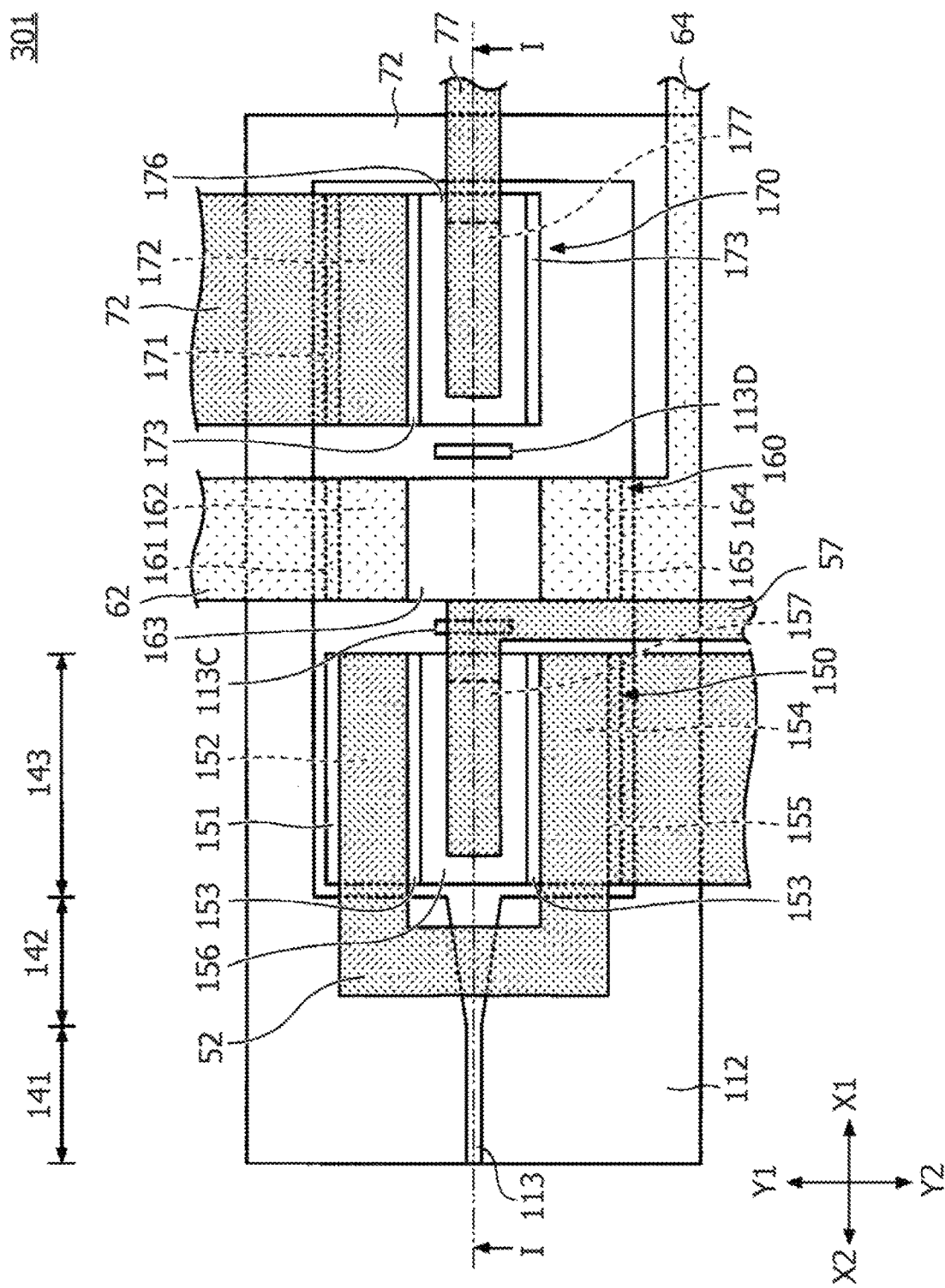
FIG. 17 is a view illustrating a layout of a region and a metal wiring of a semiconductor included in an optical semiconductor element according to a modification example of the third embodiment.
Figure 18:
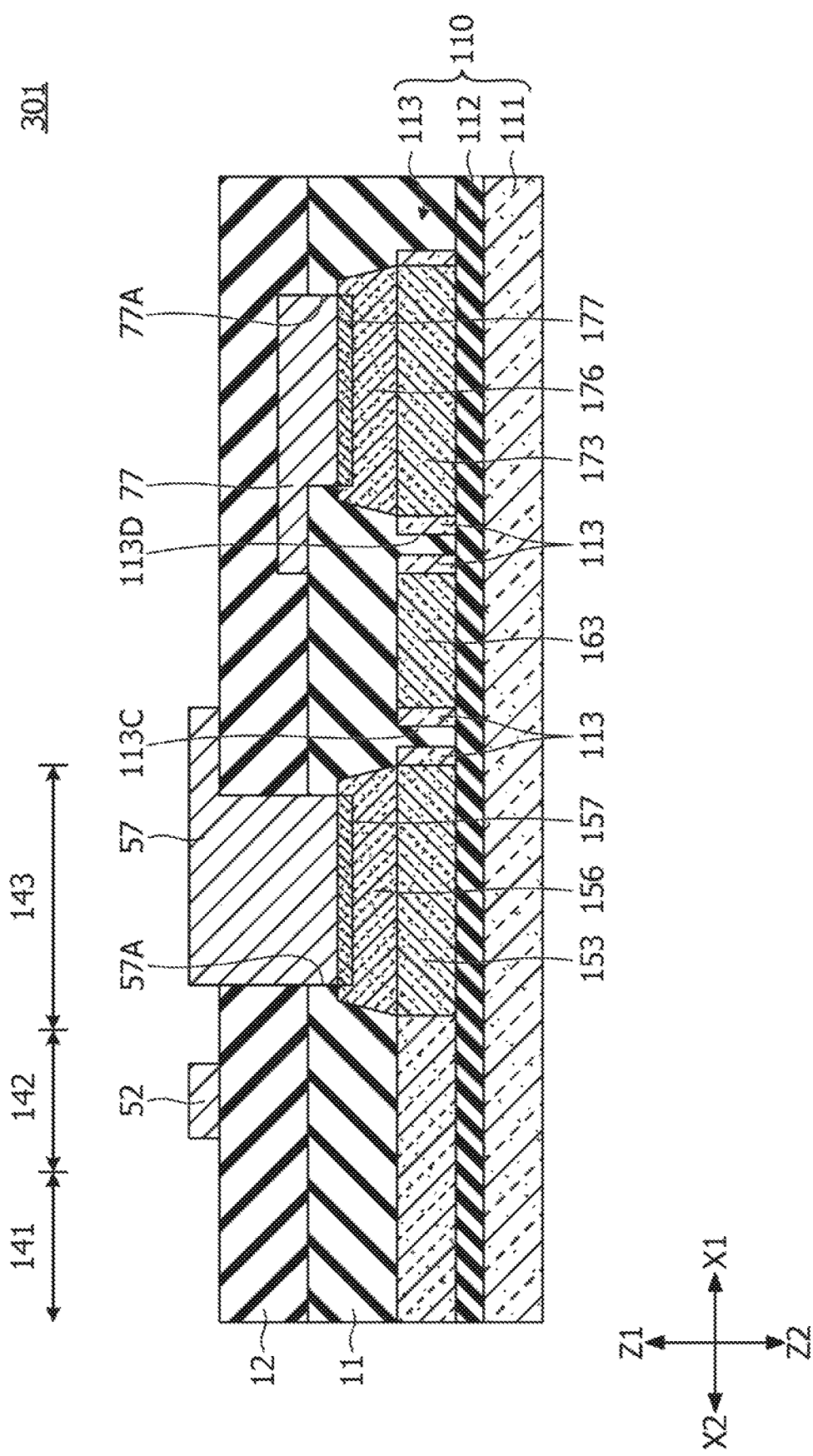
FIG. 18 is a cross-sectional view illustrating a configuration of the optical semiconductor element according to the modification example of the third embodiment.

Next, a modification example of the third embodiment is described. The modification example is different from the third embodiment in terms of the depth of the slit. FIG. 17 is a view illustrating a layout of a region and a metal wiring of a semiconductor included in an optical semiconductor element according to the modification example of the third embodiment. FIG. 18 is a cross-sectional view illustrating a configuration of an optical semiconductor element according to a modification example of the third embodiment. FIG. 18 corresponds to a cross-sectional view taken along a line I-I in FIG. 17.

In the optical semiconductor element 301 according to the modification example of the third embodiment, as illustrated in FIGS. 17 and 18, a slit 113C is formed instead of the slit 113A, and a slit 113D is formed instead of the slit 113B. Similar to the slits 113A and 113B, the slits 113C and 113D have dimensions equal to or larger than those of the end portions of the mode converter 142 on the side of the photoelectric converter 143, for example, in the Y1-Y2 direction. The depths of the slits 113C and 113D penetrate the Si layer 113 in the thickness direction, and the Si layer 113 does not remain at the bottom of the slits 113C and 113D, and therefore the Si oxide film 112 is exposed from the slits 113C and 113D. The other elements are the same as in the third embodiment. The slit 113C is an example of a first barrier, and the slit 113D is an example of a second barrier.

In the modification example as well, the same control as that in the first embodiment may be performed based on the dark current generated in the i-type Ge layer 176. Therefore, the same effects as those of the first embodiment may be obtained. Similarly to the third embodiment, even if light which has not been absorbed by the optical receiver 150 is present, it is possible to suppress the light from reaching the i-type Ge layer 176. Further, since the Si layer 113 is not present at the bottom of the slits 113C and 113D, the propagation of light may be more reliably suppressed.

In the third embodiment and the modification example thereof, the p+Si region 174 and the p−Si region 175 may be formed similarly to the first embodiment.

Figure 19:
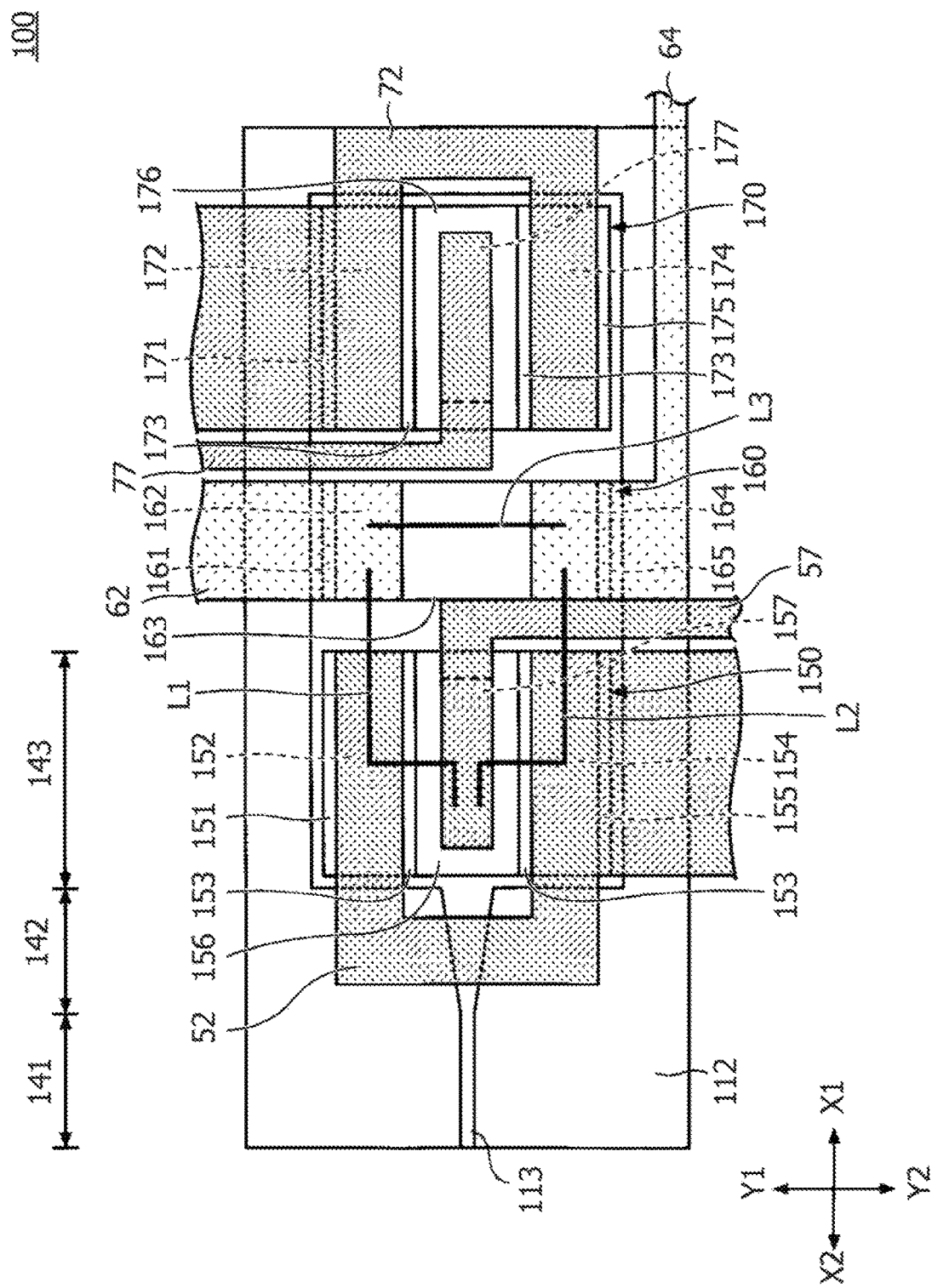
FIG. 19 is a view (part 2) illustrating a layout of the region and the metal wiring of the semiconductor included in the optical semiconductor element according to the first embodiment.
Figure 20:
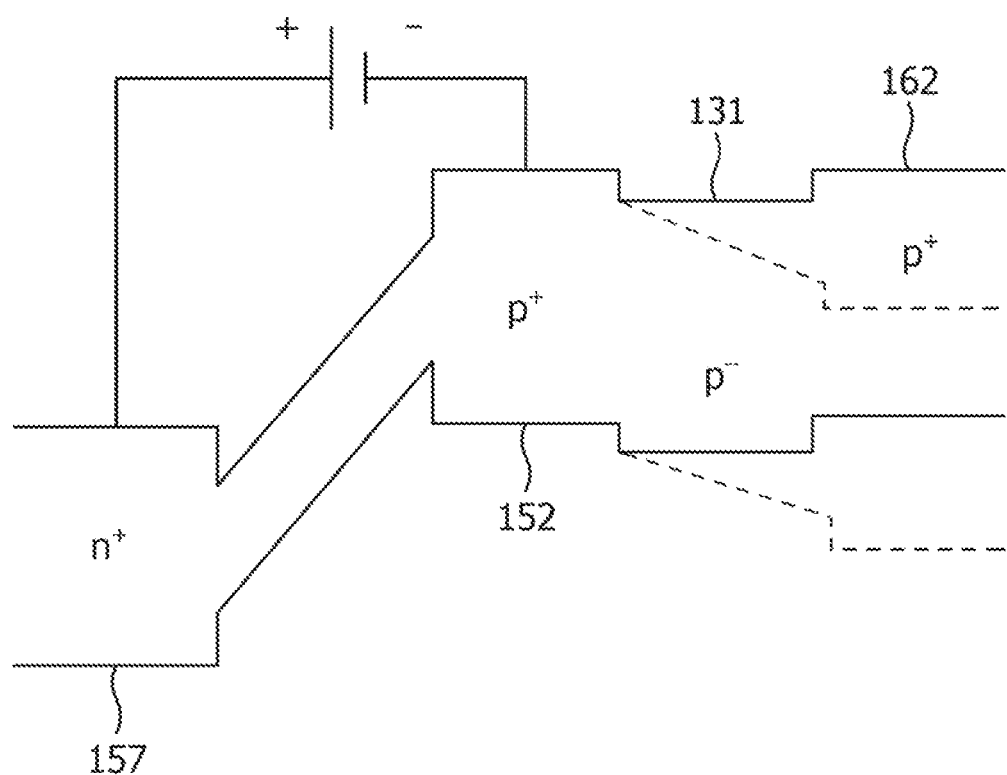
FIG. 20 is a view (part 1) illustrating a band structure according to the first embodiment.
Figure 21:
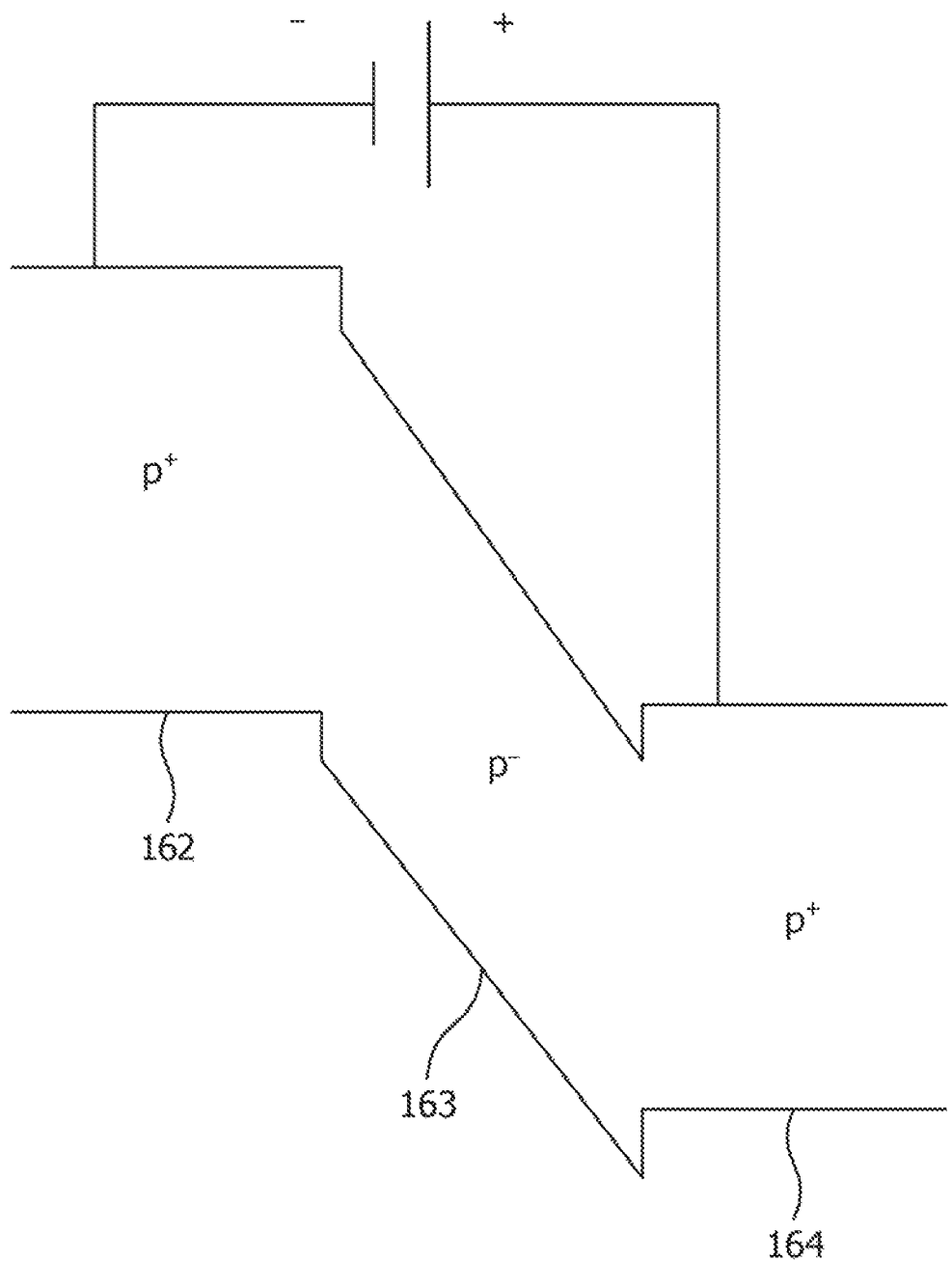
FIG. 21 is a view (part 2) illustrating the band structure according to the first embodiment.
Figure 22:
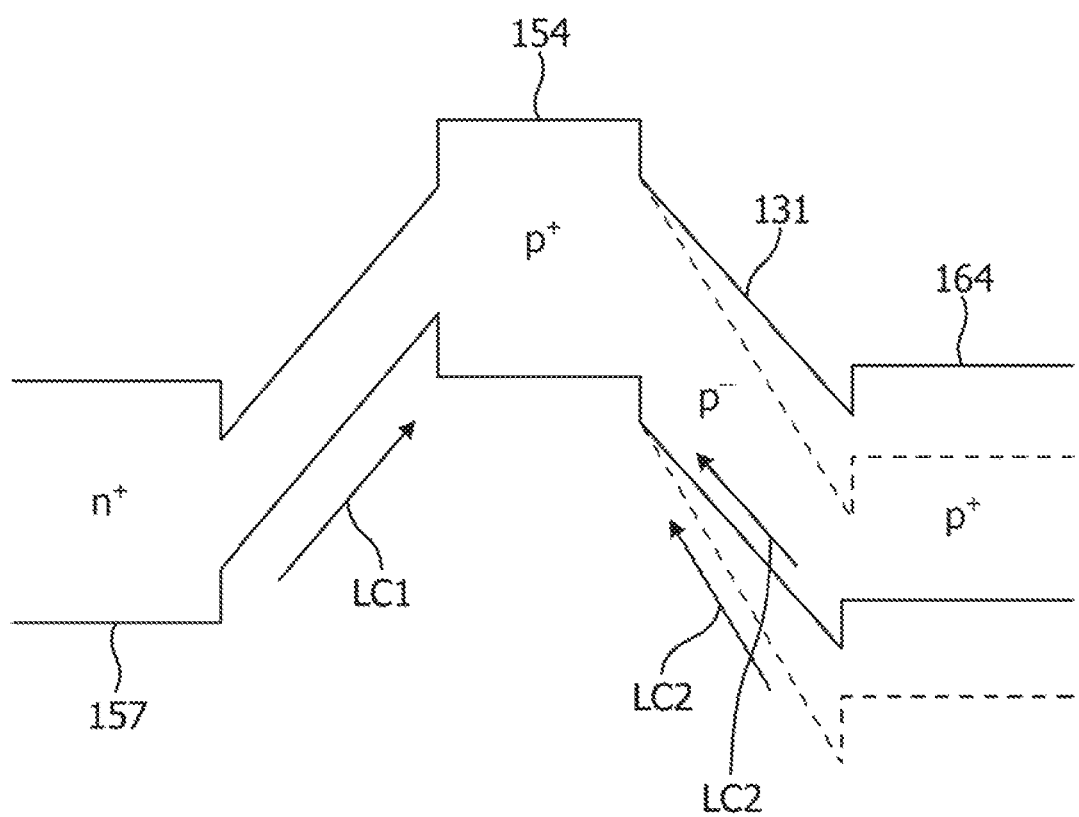
FIG. 22 is a view (part 3) illustrating the band structure according to the first embodiment.

In the first embodiment, in the heater 160, electric carriers accumulate on the surface of the Si layer 113 in accordance with a long-time operation or the like, and the accumulation of electric carriers may affect the current. When the power of the heater 160 is large, a value obtained by adding leakage current from the heater 160 and dark current is output as a current. FIG. 19 is used in order to explain the generation of leakage current in the first embodiment. FIGS. 20 to 22 are views illustrating a band structure according to the first embodiment. FIG. 20 illustrates a band structure of a cross section along a thick line L in FIG. 19. FIG. 21 illustrates a band structure of a cross section along a thick line L3 in FIG. 19. FIG. 22 illustrates a band structure of a cross section along a thick line L2 in FIG. 19. In FIGS. 20 to 22, the conductivity type of the region between the p$^+$Si region 154 and the p$^+$Si region 164 and between the p$^+$Si region 152 and the p$^+$Si region 162 of the Si layer 113 is denoted by p$^-$, but these regions may be regarded as an i-type region. The same applies to the following drawings.

As described above, a reverse bias is applied to the optical receiver 150. Therefore, the leakage current LC1 flows from the n$^+$Ge region 157 to the p$^+$Si regions 152 and 154.

The p$^+$Si regions 162, 172 and 174 are also grounded, and a positive potential is applied to the p$^+$Si region 164 through the metal wiring 64. In FIGS. 20 to 22, the band structure when the potentials of the p$^+$Si regions 152, 154, 162, 172, and 174 are the ground potential is indicated by the solid line in FIG. 22. In this state, as illustrated in FIG. 19, a leakage current LC2 flows from the p$^+$Si region 164 to the p$^+$Si regions 154 and 174 in a cross section along the broken line 3.

When electric carriers accumulate on the surface of the Si layer 113 due to the long-time operation or the like, the potentials of the p$^+$Si regions 162 and 164 may be displaced to the negative side. In FIGS. 20 to 22, the band structure when the potentials of the p$^+$Si regions 162 and 164 are displaced is indicated by the broken line in FIG. 22. At this time, the displacement amount of the potential in the p$^+$Si region 164 is larger than the displacement amount of the potential in the p$^+$Si region 162. As a result of such displacement, the leakage current LC2 is increased.

Since the leakage current LC2 flows into the monitor 170, not only the dark current but also the leakage current LC2 flows through the IV converter 191. Therefore, there may be a shift in the relationship between the temperature of the i-type Ge layer 156 and the current flowing through the IV converter 191. Such a phenomenon may also occur in the modification example of the first embodiment, the second embodiment, the third embodiment, and the modification example thereof.

The fourth embodiment to the ninth embodiment is intended to suppress the deterioration in accuracy due to the influence of such leakage current.

Fourth Embodiment

Figure 23:
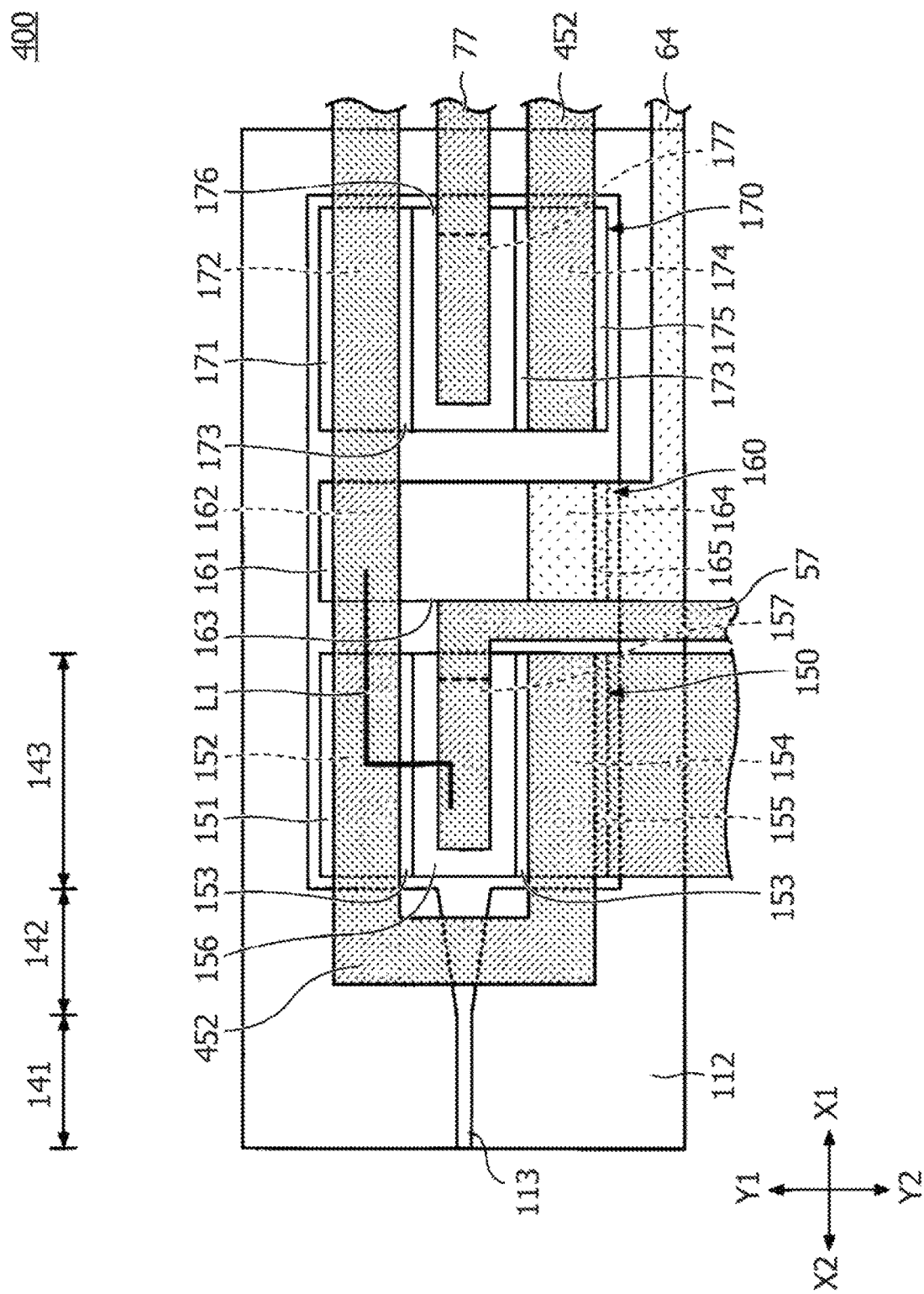
FIG. 23 is a view illustrating a layout of a region and a metal wiring of a semiconductor included in an optical semiconductor element according to a fourth embodiment.

Next, a fourth embodiment is described. The fourth embodiment is different from the first embodiment in terms of a configuration of a metal wiring. FIG. 23 is a view illustrating a layout of a region and a metal wiring of a semiconductor included in an optical semiconductor element according to the fourth embodiment.

As illustrated in FIG. 23, the optical semiconductor element 400 according to the fourth embodiment is provided with a metal wiring 452 in which the metal wirings 52, 62, and 72 are integrated, instead of the metal wirings 52, 62, and 72. The metal wiring 452 is in ohmic contact with the p$^+$Si region 172 through the opening portion 52A, ohmic contact with the p$^+$Si region 152 through the opening portion 54A, ohmic contact with the p$^+$Si region 154 through the opening portion 62A, ohmic contact with the p$^+$Si region 162 through the opening portion 72A, and ohmic contact with the p$^+$Si region 174 through the opening portion 74A. The other elements are the same as in the first embodiment. The p$^+$Si regions 152 and 154 are examples of a first semiconductor region, the p$^+$Si region 162 is an example of a second semiconductor region, the p$^+$Si regions 172 and 174 are an example of a third semiconductor region, and the metal wiring 452 is an example of an electrode.

Figure 24:
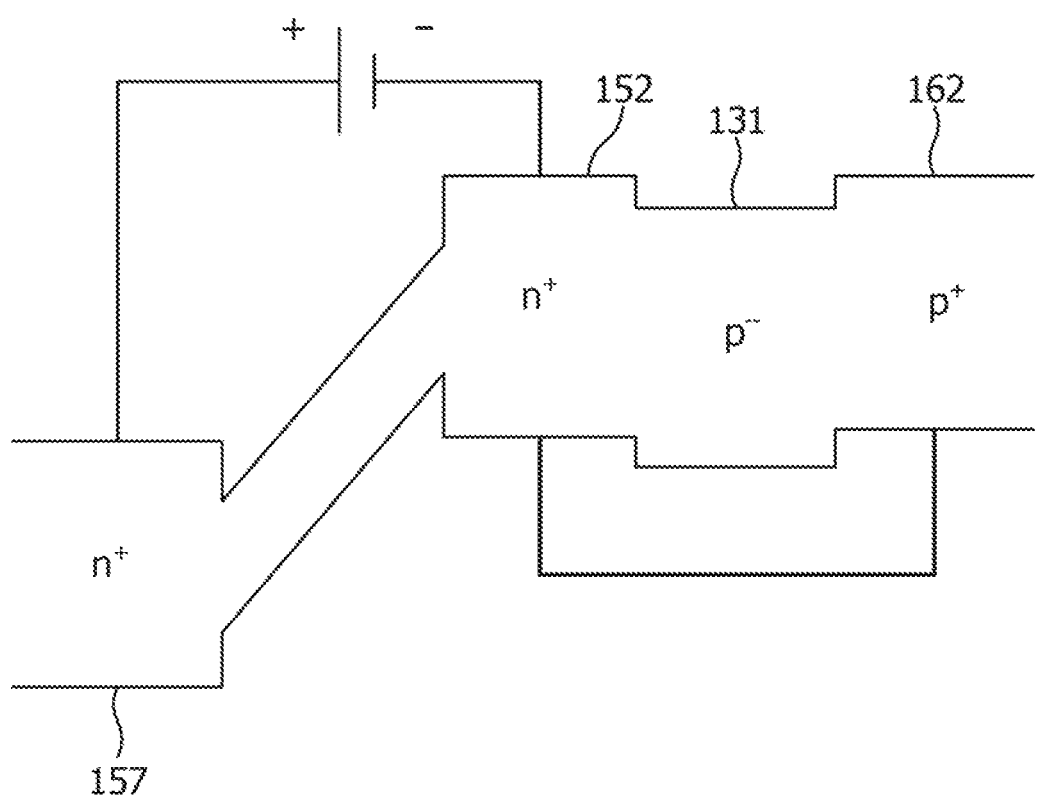
FIG. 24 is a view illustrating a band structure according to the fourth embodiment.

FIG. 24 is a view illustrating a band structure according to the fourth embodiment. FIG. 24 illustrates a band structure of a cross section along a thick line L1 in FIG. 23. In the fourth embodiment, the p$^+$Si region 162 is electrically coupled to the p$^+$Si regions 152, 154, 172, and 174 via the metal wiring 452. The p$^+$Si region 162 and the p$^+$Si regions 152 may have an equipotential. Therefore, as illustrated in FIG. 24, the upper end of the valence band of the p$^+$Si region 162 becomes coincident with the upper end of the valence band such as the p$^+$Si region 152, and therefore accumulation of electric carriers may be suppressed. As a result, an increase in leakage current due to accumulation of electric carriers may be suppressed.

Fifth Embodiment

Figure 25:
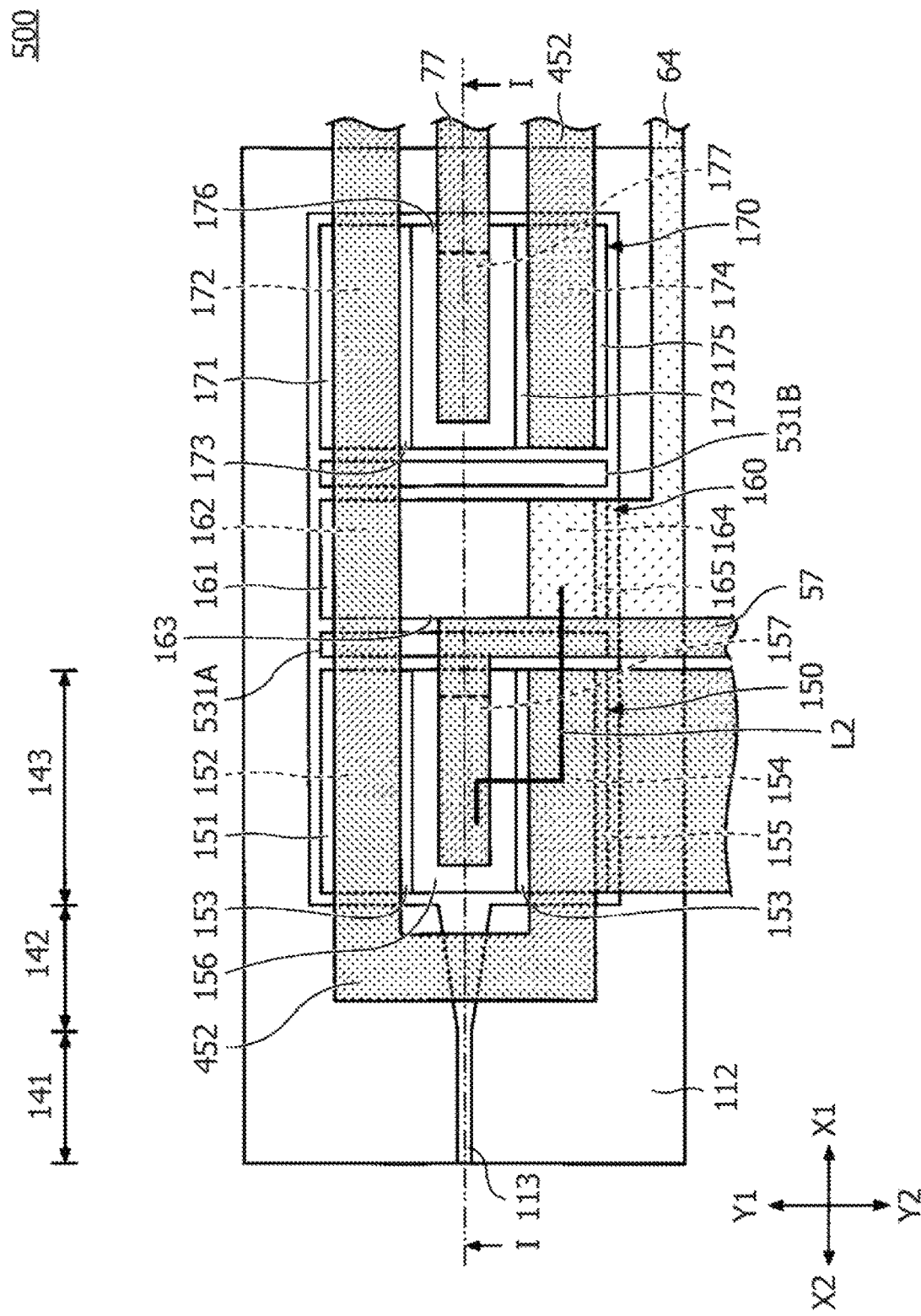
FIG. 25 is a view illustrating a layout of a region and a metal wiring of a semiconductor included in an optical semiconductor element according to a fifth embodiment.
Figure 26:
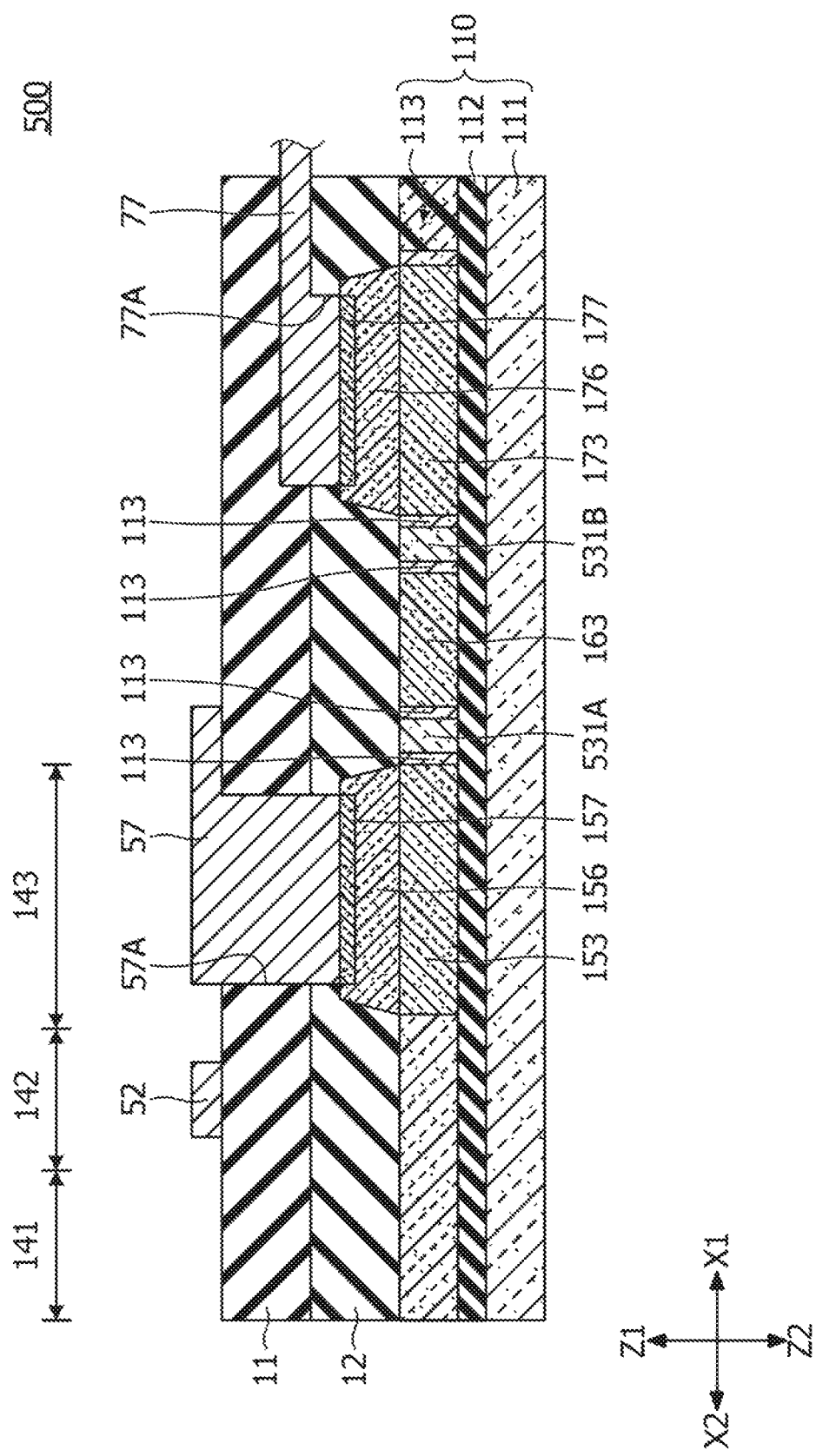
FIG. 26 is a cross-sectional view illustrating a configuration of an optical semiconductor element according to the fifth embodiment.

Next, a fifth embodiment is described. The fifth embodiment is different from the fourth embodiment in that an n$^+$region is formed between the optical receiver 150 and the heater 160 and between the heater 160 and the monitor 170. FIG. 25 is a view illustrating a layout of a region and a metal wiring of a semiconductor included in an optical semiconductor element according to the fifth embodiment. FIG. 26 is a cross-sectional view illustrating a configuration of an optical semiconductor element according to a fifth embodiment. FIG. 26 corresponds to a cross-sectional view taken along the line I-I in FIG. 25.

In the optical semiconductor element 500 according to the fifth embodiment, as illustrated in FIGS. 25 and 26, an n$^+$Si region 531A between the optical receiver 150 and the heater 160 and an n$^+$Si region 531B between the heater 160 and the monitor 170 are formed in the Si layer 113, respectively. The other elements are the same as in the fourth embodiment. The n$^+$Si region 531A is an example of a fourth semiconductor region, and the n$^+$Si region 531B is an example of a fifth semiconductor region.

Figure 27:
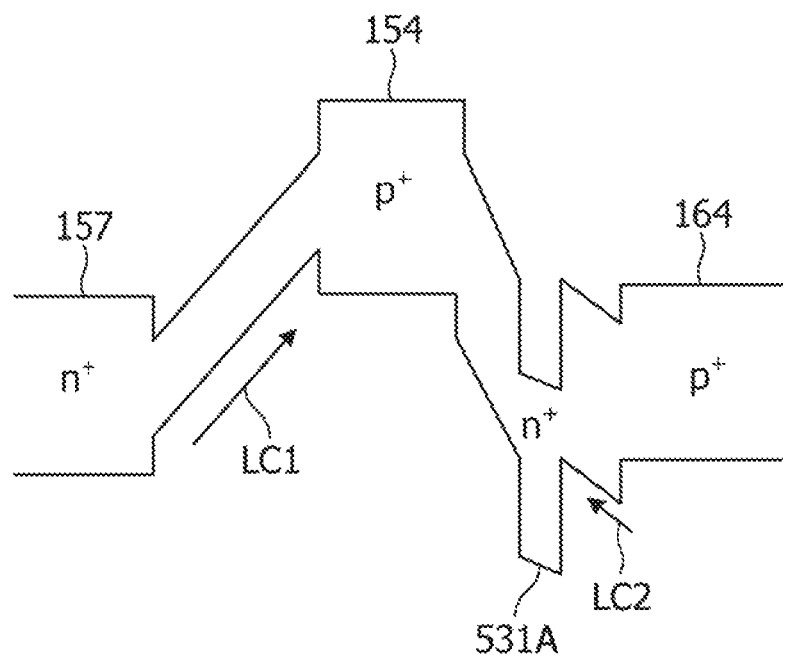
FIG. 27 is a view illustrating a band structure according to the fifth embodiment.

FIG. 27 is a view illustrating a band structure according to the fifth embodiment. FIG. 27 illustrates a band structure of a cross section along a thick line L2 in FIG. 25. In the fifth embodiment, the n$^+$Si region 531A is formed between the p$^+$Si region 154 and the p$^+$Si region 164, and the n$^+$Si region 531B is formed between the p$^+$Si region 164 and the p$^+$Si region 174. Therefore, as illustrated in FIG. 27, the n$^+$Si regions 531A and 531B function as a barrier for the leakage current LC2. As a result, it is possible to suppress the leakage current LC2 from flowing into the monitor 170.

Sixth Embodiment

Figure 28:
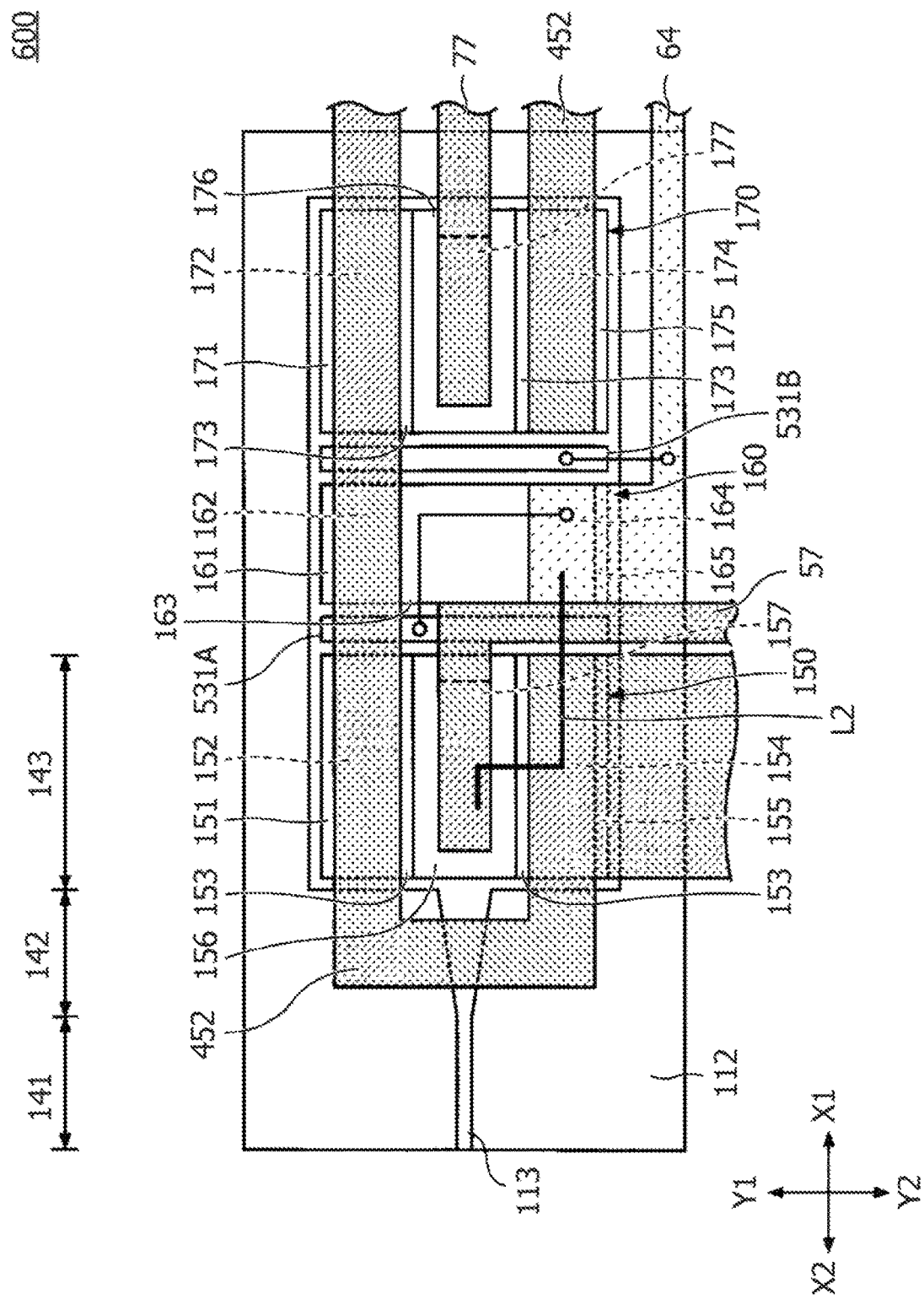
FIG. 28 is a view illustrating a layout of a region and a metal wiring of a semiconductor included in an optical semiconductor element according to a sixth embodiment.

Next, a sixth embodiment is described. The sixth embodiment differs from the fifth embodiment in that the n$^+$Si regions 531A and 531B are coupled to the metal wiring 64. FIG. 28 is a view illustrating a layout of a region and a metal wiring of a semiconductor included in an optical semiconductor element according to the sixth embodiment.

In an optical semiconductor element 600 according to the sixth embodiment, as illustrated in FIG. 28, the n+Si regions 531A and 5316 are coupled to the metal wiring 64 in the same manner as the p+Si region 164. The other elements are the same as in the fifth embodiment. The metal wiring 64 is an example of a second electrode.

Figure 29:
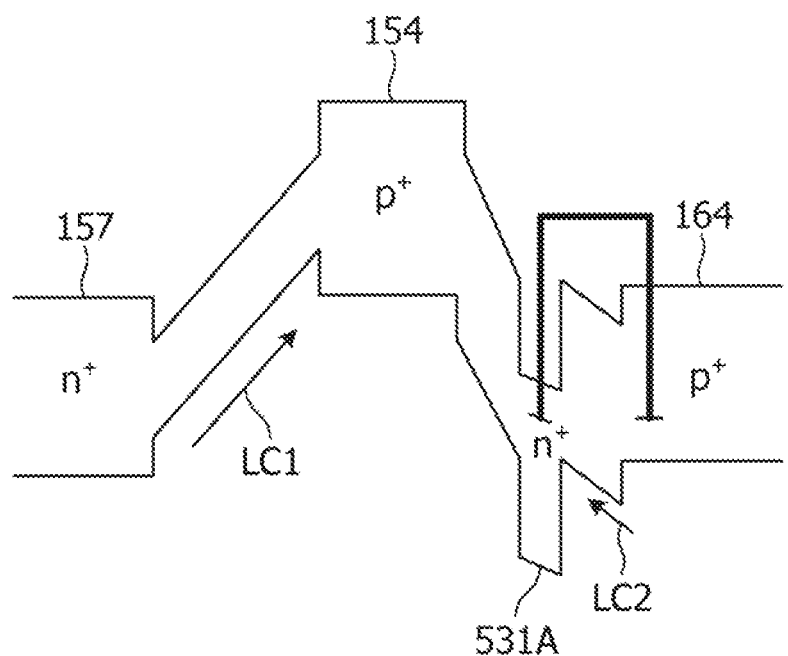
FIG. 29 is a view illustrating a band structure according to the sixth embodiment.

FIG. 29 is a view illustrating a band structure according to the sixth embodiment. FIG. 29 illustrates a band structure of a cross section along the thick line L2 in FIG. 28. In the sixth embodiment as well, similarly to the fifth embodiment, it is possible to suppress the flow of the leakage current LC2 into the monitor 170. In the sixth embodiment, as illustrated in FIG. 29, the potentials of the n+Si regions 531A and 531B may be maintained at the same potential as the potential of the p+Si region 164.

Seventh Embodiment

Figure 30:
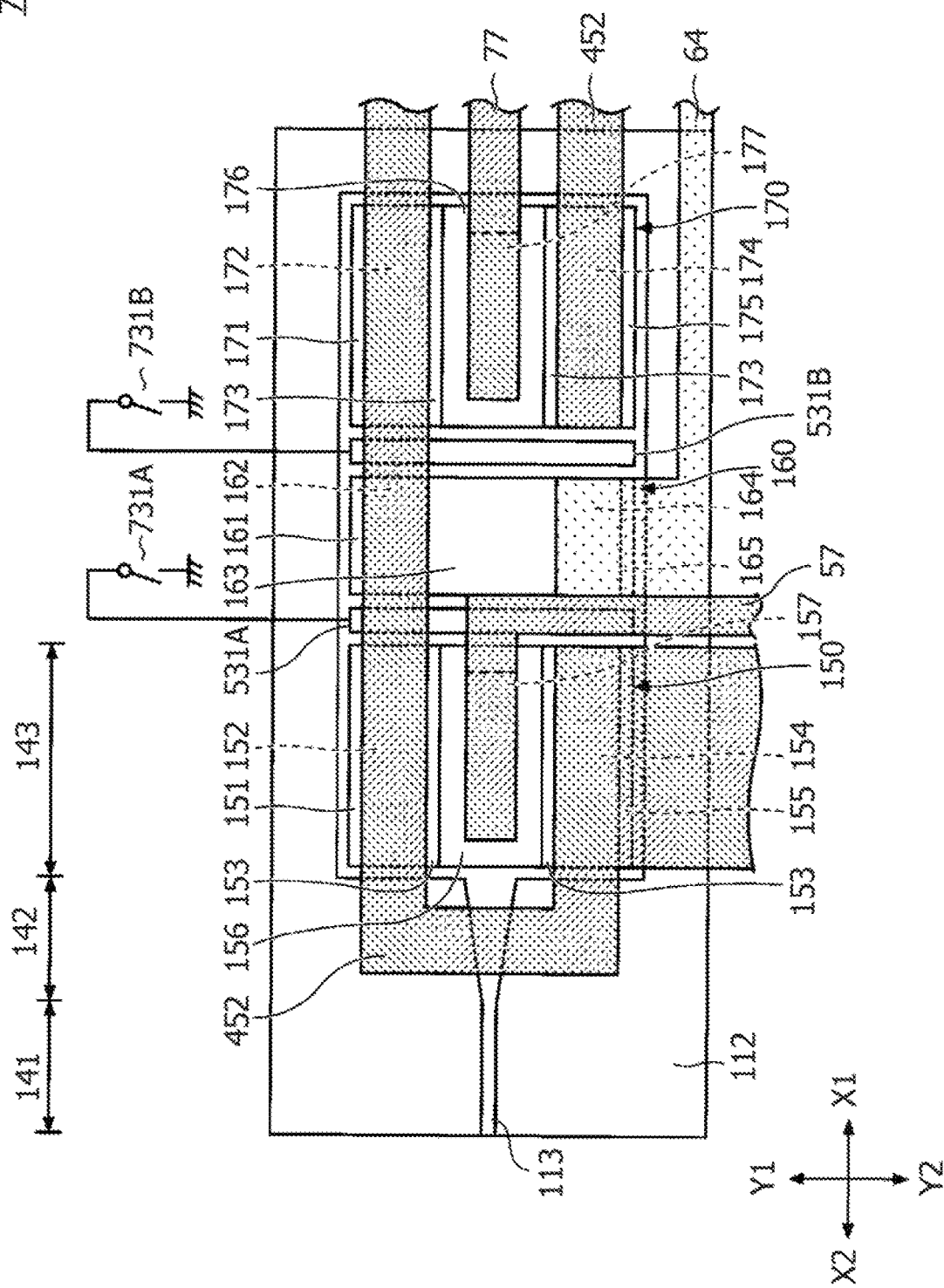
FIG. 30 is a view illustrating a layout of a region and a metal wiring of a semiconductor included in an optical semiconductor element according to a seventh embodiment.

Next, a seventh embodiment is described. The seventh embodiment differs from the fifth embodiment in that a switch is provided between the n+Si regions 531A and 531B and the ground. FIG. 30 is a view illustrating a layout of a region and a metal wiring of a semiconductor included in an optical semiconductor element according to the seventh embodiment.

In an optical semiconductor element 700 according to the seventh embodiment, as illustrated in FIG. 30, a switch 731A is provided between the n+Si region 531A and the ground, and a switch 731B is provided between the n+Si region 531 and the ground. The other elements are the same as in the fifth embodiment. The switch 731A is an example of a first switch, and the switch 731B is an example of a second switch.

According to the seventh embodiment, the same effects as those of the fifth embodiment may be obtained. Since the switches 731A and 731B are provided, carriers accumulated in the notch formed by the n+Si region may be allowed to flow, and leakage current may be reduced semi-permanently. For example, when carriers are accumulated in the notch, the band is changed to cause leakage current, but it is possible to remove the carriers.

Eighth Embodiment

Figure 31:
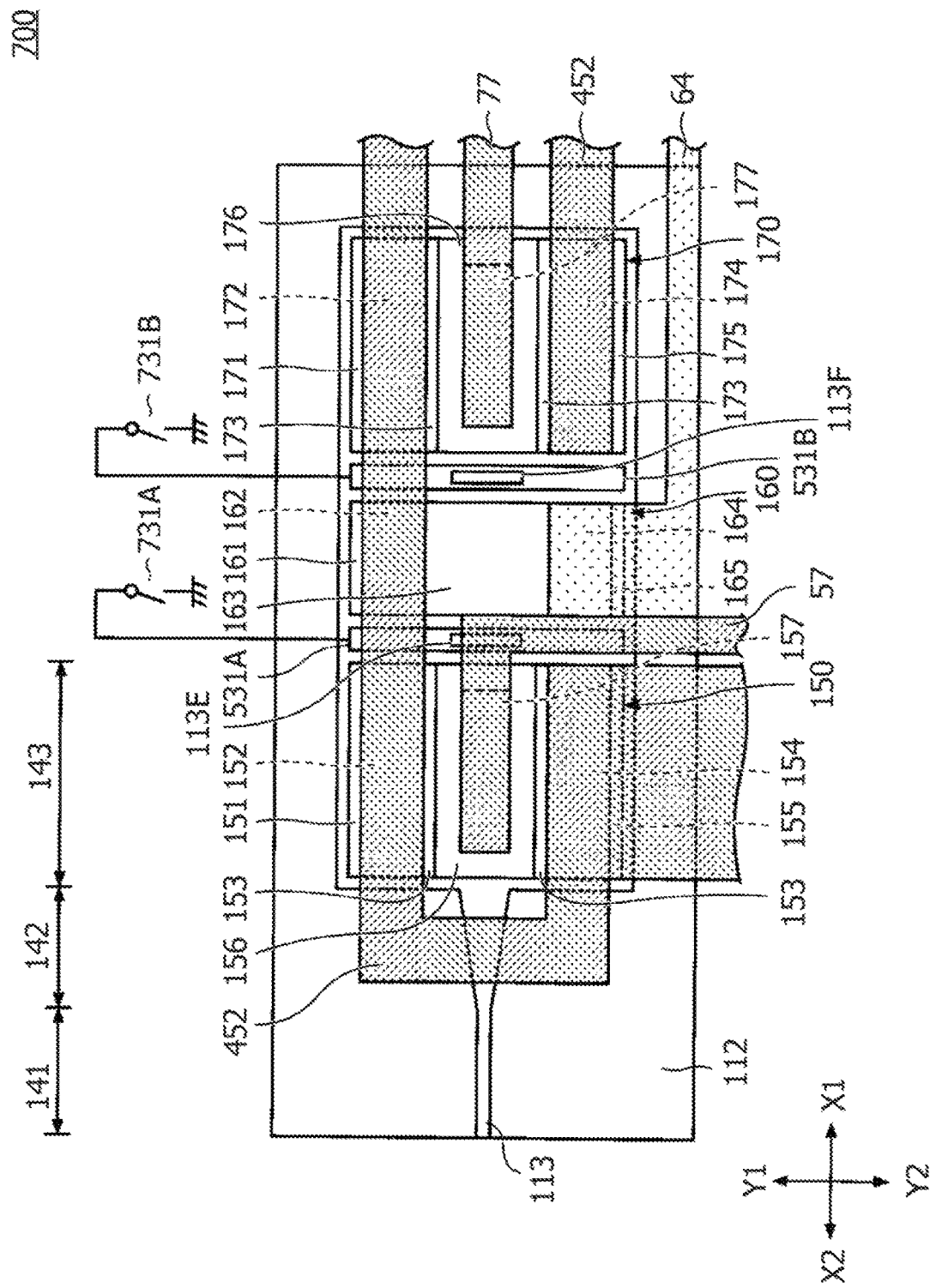
FIG. 31 is a view illustrating a layout of a region and a metal wiring of a semiconductor included in an optical semiconductor element according to an eighth embodiment.

Next, an eighth embodiment will be described. The eighth embodiment is different from the seventh embodiment in that slits are formed in the n+Si regions 531A and 531B. FIG. 31 is a view illustrating a layout of a region and a metal wiring of a semiconductor included in an optical semiconductor element according to the eighth embodiment.

In the optical semiconductor element 600 according to the eighth embodiment, as illustrated in FIG. 31, a slit 113E is formed in the n+Si region 531A, and a slit 113F is formed in the n+Si region 531B. The slit 113E is a slit similar to the slit 113A or 113C, and the slit 113F is a slit similar to the slit 113A or 113D. The other elements are the same as in the seventh embodiment. The slit 113E is an example of a first barrier, and the slit 113F is an example of a second barrier.

According to the eighth embodiment, the effects of the third embodiment or the modification example thereof and the effect of the seventh embodiment may be obtained.

In the fourth to the sixth embodiment, the slit 113E may be formed in the n+Si region 531A, and the slit 113F may be formed in the n+Si region 531B.

Ninth Embodiment

Figure 32:
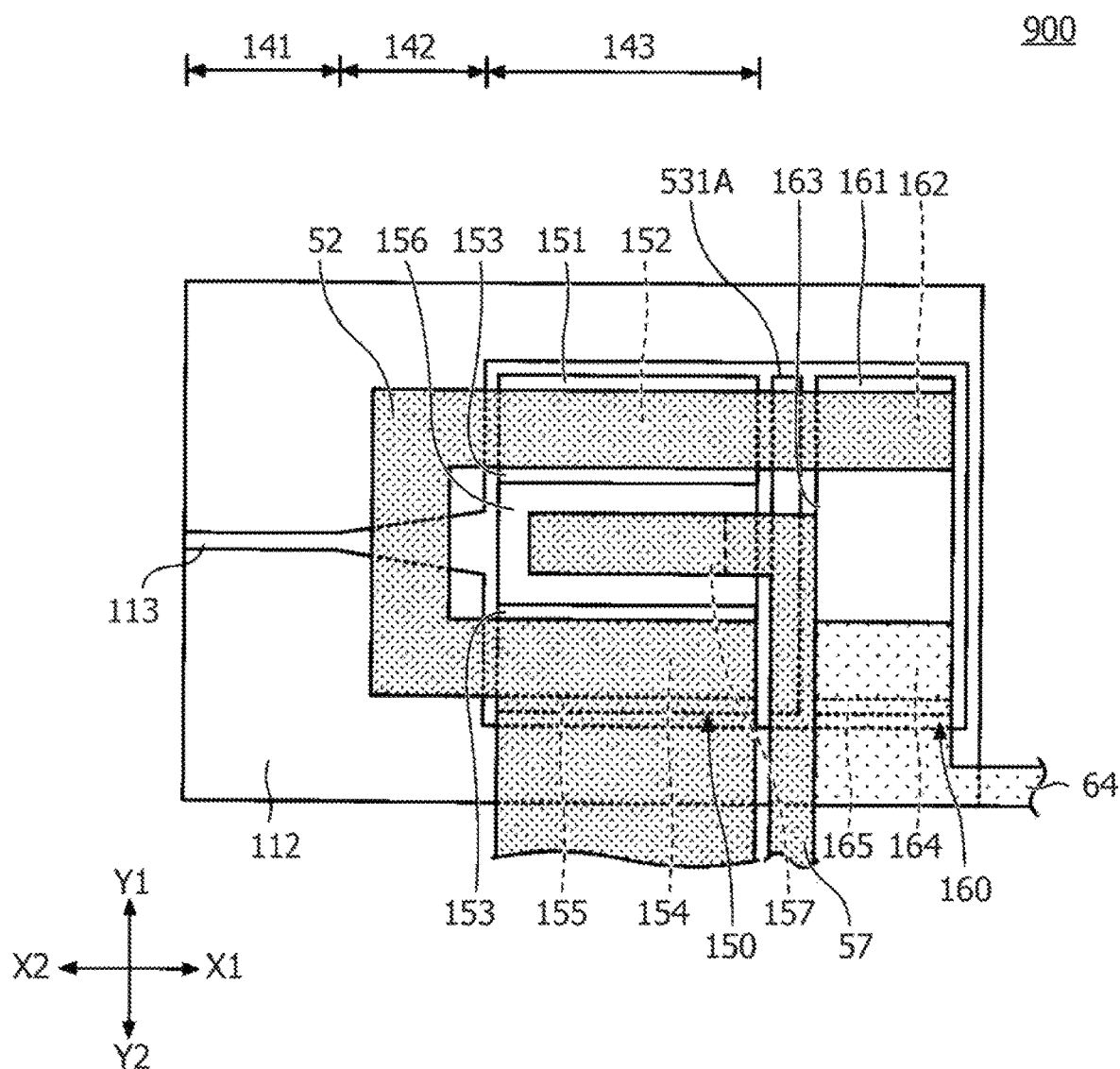
FIG. 32 is a view illustrating a layout of a region and a metal wiring of a semiconductor included in an optical semiconductor element according to a ninth embodiment.

Next, a ninth embodiment will be described. The ninth embodiment is different from the fifth embodiment in that the monitor 170 is not provided. FIG. 32 is a view illustrating a layout of a region and a metal wiring of a semiconductor included in an optical semiconductor element according to the ninth embodiment.

According to the ninth embodiment, it is possible to obtain the effect of suppressing the increase in the leakage current LC2 due to the accumulation of electric carriers and the effect of the barrier of the leakage current LC2 caused by the n+Si region 531A.

The impurities contained in the semiconductor layer may be introduced by ion implantation, for example.

The light absorption layer included in the optical receiver is not limited to a light absorption layer of a PIN type PD. For example, a light absorption layer of an avalanche photodiode (APD) may be used, and a light absorption layer of a uni-traveling-carrier photodiode (UTC-PD) may also be used.

The materials of the first and second semiconductor layers are not limited to Ge, and for example, $Si_xGe_{1-x}$ (0≤x<1) or $Ge_{1-x}Sn_x$ (0≤x<1) may be used as materials for the first and second semiconductor layers.

Although the preferred embodiments and the like have been described in detail, the above-described embodiments and the like are not limiting. Various modifications and various types of replacement may be added to the above-described embodiments and the like without departing from the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical semiconductor element comprising:
   an optical receiver including a first semiconductor layer that absorbs light and generates electric carriers;
   a heater that heats the first semiconductor layer; and
   a monitor including a second semiconductor layer in which dark current is changed by heat generated by the heater.

2. The optical semiconductor element according to claim 1,
   wherein the first semiconductor layer and the second semiconductor layer are $Si_xGe_{1-x}$ layers (0≤x<1) or $Ge_{1-x}Sn_x$ layers (0≤x<1).

3. The optical semiconductor element according to claim 1, further comprising:
   a waveguide that guides light to the optical receiver,
   wherein the monitor is disposed so as to be shifted from an extended line of an optical axis of the waveguide.

4. The optical semiconductor element according to claim 1, further comprising:
   a first barrier that suppresses light propagation between the optical receiver and the heater; and
   a second barrier that suppresses light propagation between the heater and the monitor.

5. The optical semiconductor element according to claim 4, further comprising:

a third semiconductor layer which is provided over the optical receiver, the heater, and the monitor and through which the light propagates, wherein the first semiconductor layer and the second semiconductor layer are formed over the third semiconductor layer, the first barrier includes a first slit formed in the third semiconductor layer, and the second barrier includes a second slit formed in the third semiconductor layer.

6. The optical semiconductor element according to claim 5, wherein the first slit and the second slit penetrate the third semiconductor layer in a thickness direction.

7. The optical semiconductor element according to claim 1, wherein a temperature of the first semiconductor layer and a temperature of the second semiconductor layer are increased to be equal to each other by the heater.

8. The optical semiconductor element according t claim 7, wherein the heater is positioned at a center position between the first semiconductor layer and the second semiconductor layer.

9. The optical semiconductor element according to claim 1, further comprising:

an electrode common to the optical receiver and the heater.

10. The optical semiconductor element according to claim 9, wherein the electrode is also common to the monitor.

11. The optical semiconductor element according to claim 10, wherein the optical receiver includes a first semiconductor region of a first conductivity type with which the electrode is in ohmic contact, the heater includes a second semiconductor region of the first conductivity type with which the electrode is in ohmic contact, the monitor includes a third semiconductor region of the first conductivity type with which the electrode is in ohmic contact, a fourth semiconductor region of a second conductivity type is included between the first semiconductor region and the second semiconductor region, and a fifth semiconductor region of the second conductivity type is included between the second semiconductor region and the third semiconductor region.

12. The optical semiconductor element according to claim 11, further comprising:

a second electrode that applies power to the heater between the electrode and the second electrode, wherein the fourth semiconductor region and the fifth semiconductor region are electrically coupled to the second electrode.

13. The optical semiconductor element according to claim 11, further comprising:

a first switch provided between the fourth semiconductor region and ground; and a second switch provided between the fifth semiconductor region and ground.

14. An optical semiconductor device comprising:

an optical receiver including a first semiconductor layer that absorbs light and generates electric carriers;

a heater that heats the first semiconductor layer;

a monitor including a second semiconductor layer in which dark current is changed by heat generated by the heater; and a controller that controls the heater based on the dark current.

15. The optical semiconductor device according to claim 14, wherein the first semiconductor layer and the second semiconductor layer are $Si_xGe_{1-x}$ layers ($0 \leq x<1$) or $Ge_{1-x}Sn_x$ layers ($0 \leq x<1$).

16. The optical semiconductor device according to claim 14, further comprising:

a waveguide that guides light to the optical receiver, wherein the monitor is disposed so as to be shifted from an extended line of an optical axis of the waveguide.

17. The optical semiconductor device according to claim 14, further comprising:

a first barrier that suppresses light propagation between the optical receiver and the heater; and a second barrier that suppresses light propagation between the heater and the monitor.

18. The optical semiconductor device according to claim 14, wherein a temperature of the first semiconductor layer and a temperature of the second semiconductor layer are increased to be equal to each other by the heater.

19. An optical semiconductor element comprising:

an optical receiver including a first semiconductor layer that absorbs light and generates electric carriers;

a monitor including a second semiconductor layer; and a heater arranged between the optical receiver and the monitor that heats the first semiconductor layer and the second semiconductor layer.

20. The optical semiconductor element according to claim 19, wherein the heater heats the first semiconductor layer to increase light receiving sensitivity on a long wavelength side of a detection range of the optical receiver.

* * * * *